United States Patent
Hattori et al.

(10) Patent No.: US 9,313,892 B2
(45) Date of Patent: Apr. 12, 2016

(54) ELECTRONIC COMPONENT AND ELECTRONIC COMPONENT PACKAGE

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Masanori Fujidai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 131 days.

(21) Appl. No.: 14/198,610

(22) Filed: Mar. 6, 2014

(65) Prior Publication Data

US 2014/0284089 A1  Sep. 25, 2014

(30) Foreign Application Priority Data

Mar. 19, 2013 (JP) ................... 2013-055941
Jun. 7, 2013 (JP) ................... 2013-120623

(51) Int. Cl.
| | |
|---|---|
| H05K 1/16 | (2006.01) |
| H05K 7/00 | (2006.01) |
| H05K 1/14 | (2006.01) |
| H01G 4/30 | (2006.01) |
| H01G 4/232 | (2006.01) |
| H05K 3/34 | (2006.01) |
| H01G 2/06 | (2006.01) |

(52) U.S. Cl.
CPC .............. *H05K 1/141* (2013.01); *H01G 2/065* (2013.01); *H01G 4/232* (2013.01); *H01G 4/30* (2013.01); *H05K 3/3442* (2013.01); *H05K 2201/049* (2013.01); *H05K 2201/09181* (2013.01); *H05K 2201/10015* (2013.01); *H05K 2201/2045* (2013.01); *Y02P 70/613* (2015.11)

(58) Field of Classification Search
CPC ....... H01G 2/065; H01G 2/06; H05K 3/3442; H05K 2201/049; H05K 1/181; H05K 2201/10636; H05K 1/141; H05K 2201/09181
USPC .......... 174/262–266; 361/760, 767, 768, 782
See application file for complete search history.

(56) References Cited

U.S. PATENT DOCUMENTS

| | | | |
|---|---|---|---|
| 2003/0117784 A1* | 6/2003 | Fukunabe | ............ H05K 3/3442 361/760 |
| 2004/0066589 A1* | 4/2004 | Togashi | ................. H01G 2/065 361/15 |

(Continued)

FOREIGN PATENT DOCUMENTS

| | | |
|---|---|---|
| JP | 63-49358 U | 4/1988 |
| JP | 07-212004 A | 8/1995 |

(Continued)

OTHER PUBLICATIONS

Official Communication issued in corresponding Japanese Patent Application No. 2013-120623, mailed on May 7, 2015.

*Primary Examiner* — Hoa C Nguyen
(74) *Attorney, Agent, or Firm* — Keating & Bennett, LLP

(57) ABSTRACT

An electronic component includes a laminated capacitor and a substrate-type terminal including a substrate main body, first and second component connection electrodes, first and second external connection electrodes, and first and second connection electrodes. The substrate main body is made of a material and has a thickness that significantly reduces or prevents vibration being transmitted to a circuit substrate on which it is mounted.

18 Claims, 19 Drawing Sheets

(56) References Cited

U.S. PATENT DOCUMENTS

| | | | |
|---|---|---|---|
| 2008/0253059 A1* | 10/2008 | Eggerding | H01G 4/012 361/301.4 |
| 2013/0033836 A1 | 2/2013 | Hattori et al. | |
| 2013/0037911 A1* | 2/2013 | Hattori | H01L 28/40 257/532 |
| 2013/0284507 A1* | 10/2013 | Hattori | H05K 1/18 174/260 |
| 2014/0016242 A1 | 1/2014 | Hattori et al. | |

FOREIGN PATENT DOCUMENTS

| | | | |
|---|---|---|---|
| JP | 8-55752 A | | 2/1996 |
| JP | 2004-134430 A | | 4/2004 |
| JP | 2004335657 A | * | 11/2004 |
| JP | 2005-56961 A | | 3/2005 |
| JP | 2006-186167 A | | 7/2006 |
| JP | 2012-204572 A | | 10/2012 |
| JP | 2012-212943 A | | 11/2012 |
| JP | 2012-212944 A | | 11/2012 |
| JP | 2013-038144 A | | 2/2013 |
| JP | 2013-038291 A | | 2/2013 |
| WO | 2012/090986 A1 | | 7/2012 |
| WO | 2013/008549 A1 | | 1/2013 |
| WO | 2013/008550 A1 | | 1/2013 |

* cited by examiner

LONGITUDINAL
DIRECTION

ELECTRONIC COMPONENT AND ELECTRONIC COMPONENT PACKAGE

BACKGROUND OF THE INVENTION

1. Field of the Invention

The present invention relates to an electronic component including a laminated capacitor and a substrate-type terminal on which the laminated capacitor is mounted and which is to be mounted on a circuit substrate, and an electronic component package.

2. Description of the Related Art

At present, chip components, in particular small-sized laminated capacitors, have been widely used in circuit substrates for electronic equipment which becomes thinner, for example, mobile terminals such as mobile phones. A laminated capacitor includes a rectangular parallelepiped ceramic laminate provided with internal electrodes serving as a capacitor, and external electrodes formed on both end surfaces of the ceramic laminate opposite to each other in a longitudinal direction.

Generally, the laminated capacitor is electrically and physically connected to a circuit substrate by joining the external electrodes, which are directly placed on mounting lands of the circuit substrate, to the mounting lands with a joining agent such as solder.

In such a laminated capacitor, a slight mechanical distortion occurs due to a change in applied voltage. The distortion may be transmitted to the circuit substrate, and an audible sound may be generated by and emitted from the circuit substrate. The phenomenon of generating the audible sound is called an "acoustic noise". To solve this problem, the laminated capacitor may be mounted on the circuit substrate with a substrate-type terminal sandwiched therebetween (see, for example, Japanese Patent Laying-Open No. 2004-134430 or Japanese Patent Laying-Open No. 2012-204572).

The substrate-type terminal includes upper electrodes to which the external electrodes of the laminated capacitor are joined, lower electrodes which are joined to the mounting lands of the circuit substrate, and connection conductors connected between the upper electrodes and the lower electrodes.

In an electronic component described in Japanese Patent Laying-Open No. 2004-134430, in an interposer serving as a substrate-type terminal, an arrangement direction of the lower electrodes intersects with an arrangement direction of the upper electrodes. Thus, an arrangement direction of the external electrodes of the laminated capacitor intersects with an arrangement direction of mounting electrodes of the circuit substrate such that the distortion in the laminated capacitor is less likely to be transmitted to the circuit substrate, thereby suppressing generation of an audible sound in the circuit substrate.

In the electronic component described above, a land pattern for mounting the interposer on the circuit substrate has a shape different from that of a land pattern for mounting the laminated capacitor as a single body on the circuit substrate. In a circuit substrate integrated for high-density mounting, it is not easy to change a land pattern, and the use of an interposer makes it difficult to integrate the circuit substrate.

In a chip component structural body described in Japanese Patent Laying-Open No. 2012-204572, in a substrate main body of an interposer, a groove portion is formed which is recessed to a position overlapping with a laminated capacitor when the substrate main body having the laminated capacitor arranged thereon is seen from a direction orthogonal to a main surface of the substrate main body. Thus, even when an arrangement direction of lower electrodes and an arrangement direction of upper electrodes are aligned in the interposer, high-density mounting can be maintained without changing a land pattern of an integrated circuit substrate while suppressing generation of an audible sound in the circuit substrate.

With an increase in the capacity of the laminated capacitor, the distortion in the laminated capacitor is increased, and an audible sound tends to be generated in the circuit substrate. One of the methods for solving this problem is to thicken the interposer. This leads to an increase in mounting height, which is contrary to the objective to reduce the thickness of electronic equipment and results in an unstable mounting attitude. Therefore, it is not preferable to thicken the interposer.

SUMMARY OF THE INVENTION

Preferred embodiments of the present invention provide an electronic component and an electronic component package including a plurality of electronic components capable of preventing generation of an audible sound from a circuit substrate on which the electronic component is mounted, while significantly reducing a mounting height of the electronic component.

An electronic component according to a preferred embodiment of the present invention includes a laminated capacitor and a substrate-type terminal. The laminated capacitor includes a rectangular or substantially rectangular parallelepiped laminate including a plurality of dielectric layers and a plurality of internal electrodes, and a first external electrode and a second external electrode electrically connected to the internal electrodes and located on both end surfaces of the laminate in a longitudinal direction, respectively. The substrate-type terminal includes an insulating substrate main body, a first component connection electrode located on a first main surface of the substrate main body on which the laminated capacitor is arranged, and connected to the first external electrode, a second component connection electrode located on the first main surface of the substrate main body and connected to the second external electrode, a first external connection electrode located on a second main surface of the substrate main body opposite to the first main surface, a second external connection electrode located on the second main surface of the substrate main body, a first connection electrode connecting the first component connection electrode and the first external connection electrode, and a second connection electrode connecting the second component connection electrode and the second external connection electrode. The substrate main body includes an inorganic material. The substrate main body preferably has a thickness of more than or equal to about 0.05 mm and less than or equal to about 0.4 mm, for example. The substrate main body preferably has a Young's modulus of more than or equal to about 100 GPa and less than or equal to about 400 GPa, for example.

Preferably, the Young's modulus of the substrate main body is higher than a Young's modulus of a dielectric material constituting the dielectric layers of the laminate.

In a preferred embodiment of the present invention, the inorganic material includes alumina.

In a preferred embodiment of the present invention, the inorganic material contains a glass component.

In a preferred embodiment of the present invention, a surface direction of the internal electrodes is perpendicular or substantially perpendicular to a mounting surface of the substrate-type terminal on which the laminated capacitor is mounted.

In a preferred embodiment of the present invention, a groove portion recessed to a position overlapping with the laminated capacitor when the substrate main body having the laminated capacitor arranged thereon is seen from a direction perpendicular or substantially perpendicular to the first main surface is provided in the substrate main body. Each of the first connection electrode and the second connection electrode is provided on a side wall surface of the groove portion.

An electronic component according to a preferred embodiment of the present invention includes a laminated capacitor and a substrate-type terminal. The laminated capacitor includes a rectangular or substantially rectangular parallelepiped laminate including a plurality of dielectric layers and a plurality of internal electrodes, and a first external electrode and a second external electrode electrically connected to the internal electrodes and located on both end surfaces of the laminate in a longitudinal direction, respectively. The substrate-type terminal includes an insulating substrate main body, a first component connection electrode located on a first main surface of the substrate main body on which the laminated capacitor is arranged, and connected to the first external electrode, a second component connection electrode located on the first main surface of the substrate main body and connected to the second external electrode, a first external connection electrode located on a second main surface of the substrate main body opposite to the first main surface, a second external connection electrode located on the second main surface of the substrate main body, a first connection electrode connecting the first component connection electrode and the first external connection electrode, and a second connection electrode connecting the second component connection electrode and the second external connection electrode. In a shorter direction of the laminate perpendicular or substantially perpendicular to the longitudinal direction, a dimension of the substrate main body is smaller than a dimension of the laminated capacitor.

Preferably, in the shorter direction, the dimension of the substrate main body is more than or equal to about 0.8 times and less than about 1.0 times the dimension of the laminated capacitor, for example.

In a preferred embodiment of the present invention, in the substrate main body, a first groove portion and a second groove portion penetrating from the first main surface to the second main surface of the substrate main body are provided in end surfaces or side surfaces connecting the first main surface and the second main surface. The first connection electrode is provided on a side wall surface of the first groove portion. The second connection electrode is provided on a side wall surface of the second groove portion.

In a preferred embodiment of the present invention, at least a portion of the first connection electrode is spaced relative to the end surface or the side surface. At least a portion of the second connection electrode is spaced relative to the end surface or the side surface.

In a preferred embodiment of the present invention, in the longitudinal direction of the laminate, a dimension of the substrate main body is smaller than a dimension of the laminated capacitor.

An electronic component according to a preferred embodiment of the present invention includes a laminated capacitor and a substrate-type terminal. The laminated capacitor includes a rectangular or substantially rectangular parallelepiped laminate including a plurality of dielectric layers and a plurality of internal electrodes, and a first external electrode and a second external electrode electrically connected to the internal electrodes and located on both end surfaces of the laminate in a longitudinal direction, respectively. The substrate-type terminal includes an insulating substrate main body, a first component connection electrode located on a first main surface of the substrate main body on which the laminated capacitor is arranged, and connected to the first external electrode, a second component connection electrode located on the first main surface of the substrate main body and connected to the second external electrode, a first external connection electrode located on a second main surface of the substrate main body opposite to the first main surface, a second external connection electrode located on the second main surface of the substrate main body, a first connection electrode connecting the first component connection electrode and the first external connection electrode, and a second connection electrode connecting the second component connection electrode and the second external connection electrode. In the longitudinal direction of the laminate, a dimension of the substrate main body is smaller than a dimension of the laminated capacitor.

Preferably, in the longitudinal direction of the laminate, the dimension of the substrate main body is more than or equal to about 0.8 times and less than about 1.0 times the dimension of the laminated capacitor.

In a preferred embodiment of the present invention, in the substrate main body, a first groove portion and a second groove portion penetrating from the first main surface to the second main surface of the substrate main body are provided in end surfaces or side surfaces connecting the first main surface and the second main surface. The first connection electrode is provided on a side wall surface of the first groove portion. The second connection electrode is provided on a side wall surface of the second groove portion.

In a preferred embodiment of the present invention, at least a portion of the first connection electrode is spaced relative to the end surface or the side surface. At least a portion of the second connection electrode is spaced relative to the end surface or the side surface.

An electronic component package according to a preferred embodiment of the present invention includes a plurality of electronic components according to any of the above-described preferred embodiments of the present invention, and a carrier tape including a plurality of accommodation holes respectively accommodating the electronic components. The electronic component is accommodated in the accommodation hole such that the substrate-type terminal is located on a bottom surface side of the accommodation hole. In the carrier tape, a dimension of a bottom surface of the accommodation hole in a shorter direction is smaller than a dimension of a depth of the accommodation hole.

According to various preferred embodiments of the present invention, generation of an audible sound from a circuit substrate on which the electronic component is mounted is reliably prevented, while significantly reducing a mounting height of the electronic component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
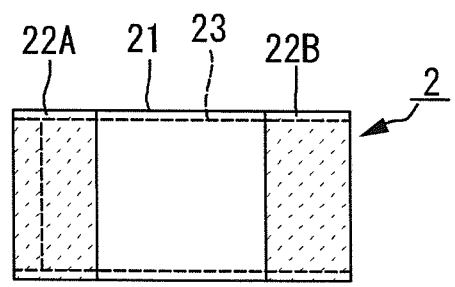
FIG. 1A is a plan view showing a configuration of a laminated capacitor included in an electronic component in accordance with a first preferred embodiment of the present invention.
Figure 1B:
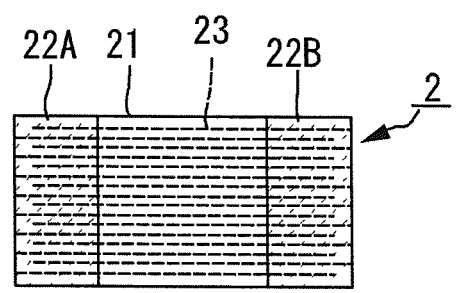
FIG. 1B is a front view showing the configuration of the laminated capacitor included in the electronic component in accordance with the first preferred embodiment of the present invention.
Figure 1C:
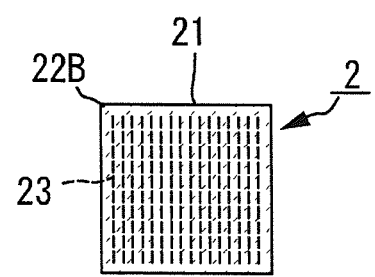
FIG. 1C is a right side view showing the configuration of the laminated capacitor included in the electronic component in accordance with the first preferred embodiment of the present invention.

An electronic component in accordance with a first preferred embodiment of the present invention will be described with reference to the drawings. FIG. 1A is a plan view showing a configuration of a laminated capacitor included in the electronic component in accordance with the first preferred embodiment of the present invention. FIG. 1B is a front view showing the configuration of the laminated capacitor included in the electronic component in accordance with the present preferred embodiment. FIG. 1C is a right side view showing the configuration of the laminated capacitor included in the electronic component in accordance with the present preferred embodiment.

Figure 2A:
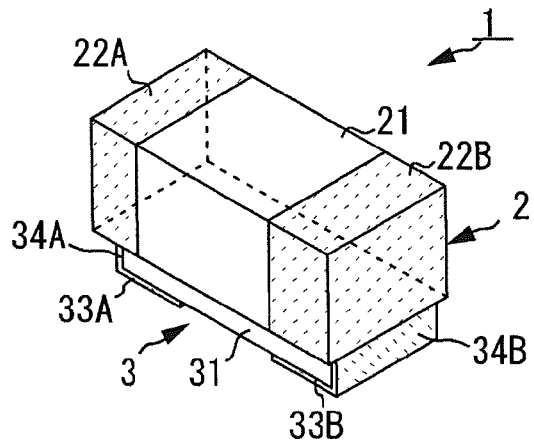
FIG. 2A is a perspective view showing an external appearance of the electronic component in accordance with the first preferred embodiment of the present invention.
Figure 2B:
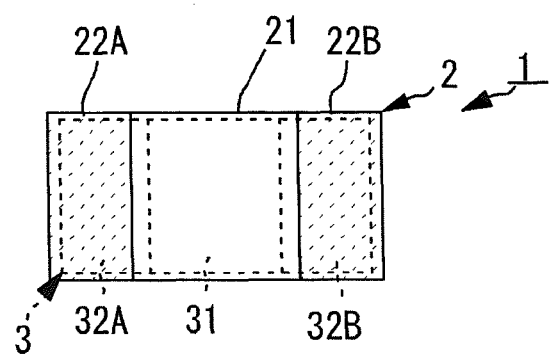
FIG. 2B is a plan view showing the external appearance of the electronic component in accordance with the first preferred embodiment of the present invention.
Figure 2C:
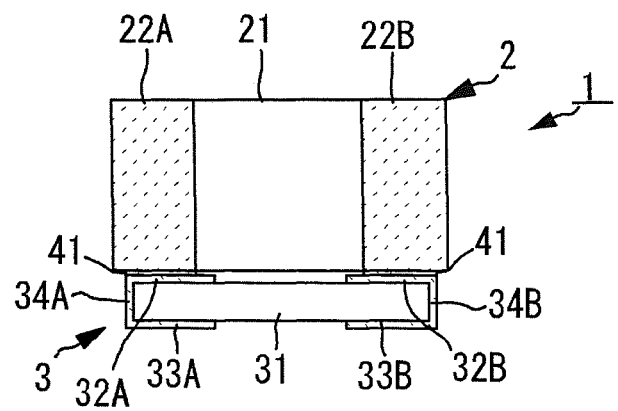
FIG. 2C is a front view showing the external appearance of the electronic component in accordance with the first preferred embodiment of the present invention.
Figure 2D:
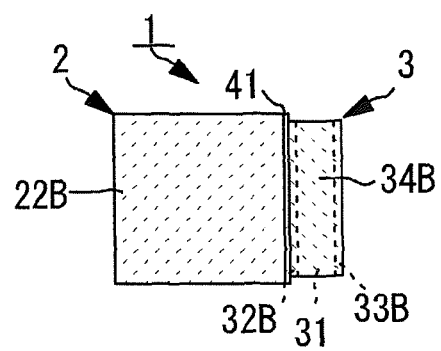
FIG. 2D is aright side view showing the external appearance of the electronic component in accordance with the first preferred embodiment of the present invention.
Figure 2E:
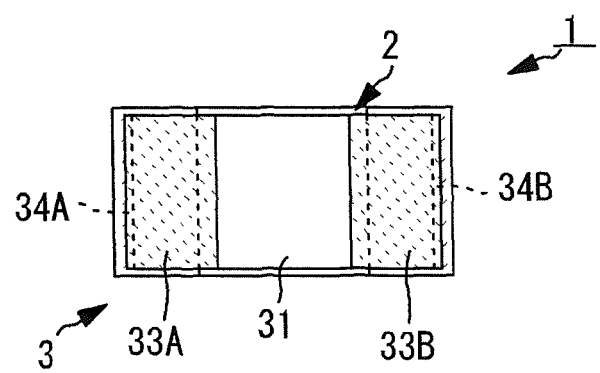
FIG. 2E is a bottom view showing the external appearance of the electronic component in accordance with the first preferred embodiment of the present invention.

FIG. 2A is a perspective view showing an external appearance of the electronic component in accordance with the present preferred embodiment. FIG. 2B is a plan view showing the external appearance of the electronic component in accordance with the present preferred embodiment. FIG. 2C is a front view showing the external appearance of the electronic component in accordance with the present preferred embodiment. FIG. 2D is a right side view showing the external appearance of the electronic component in accordance with the present preferred embodiment. FIG. 2E is a bottom view showing the external appearance of the electronic component in accordance with the present preferred embodiment.

As shown in FIGS. 1A to 1C and FIGS. 2A to 2E, an electronic component 1 includes a laminated capacitor 2 and a substrate-type terminal 3.

Laminated capacitor 2 is a so-called laminated ceramic capacitor, and includes a laminate 21, first and second external electrodes 22A, 22B, and internal electrodes 23. It is noted that any structure including a plurality of dielectric layers laminated on each other may be adopted as laminated capacitor 2, and a laminated metalized film capacitor using a resin film as a dielectric material or the like may also be adopted.

Laminate 21 has a shape of a rectangular or substantially rectangular parallel or substantially parallelepiped in which a first end surface (left side surface in FIG. 1B) and a second end surface (right side surface in FIG. 1B), which are both end surfaces of laminate 21 in a longitudinal direction, are each square or substantially square, and a plurality of ceramic dielectric layers are laminated. Laminate 21 includes a first main surface and a second main surface which connect the first end surface and the second end surface and which are perpendicular or substantially perpendicular to a lamination direction, and a first side surface and a second side surface which are parallel or substantially parallel to the lamination direction. Further, in laminate 21, internal electrodes 23 are laminated with each dielectric layer sandwiched therebetween. It is noted that the first end surface and the second end surface are not limited to have a square or substantially square shape and may also have a rectangular or substantially rectangular shape, and for example they may have a rectangular or substantially rectangular shape in which the lamination direction of laminate 21 is shorter.

First external electrode 22A is provided on the first end surface of laminate 21 (left side surface in FIG. 1B), and extended onto portions of the four surfaces (the first main surface, the second main surface, the first side surface, and the second side surface) adjacent to the first end surface of laminate 21. Second external electrode 22B is provided on the second end surface of laminate 21 (right side surface in FIG. 1B), and extended onto portions of the four surfaces (the first main surface, the second main surface, the first side surface, and the second side surface) adjacent to the second end surface of laminate 21. It is noted that first and second external electrodes 22A, 22B are satisfactorily provided as long as they are each provided on at least one surface of laminate 21.

It is noted that metal plating may be applied to provide first and second external electrodes 22A, 22B to add corrosion resistance and conductivity. Further, as external dimensions of laminated capacitor 2, laminated capacitor 2 has a dimension in the longitudinal direction×a dimension in a shorter direction of, for example, approximately 3.2 mm×1.6 mm, approximately 2.0 mm×1.25 mm, approximately 1.6 mm×0.8 mm, approximately 1.0 mm×0.5 mm, approximately 0.8 mm×0.4 mm, approximately 0.6 mm×0.3 mm, or the like.

Electronic component 1 preferably is formed by mounting laminated capacitor 2 described above on a mounting surface of substrate-type terminal 3. It is noted that, in laminated capacitor 2, a bottom surface which faces the mounting surface of substrate-type terminal 3 when laminated capacitor 2 is mounted on substrate-type terminal 3 may be any of a first main surface, a second main surface, a first side surface, and a second side surface. When the first main surface or the second main surface of laminated capacitor 2 is used as the bottom surface which faces substrate-type terminal 3, a surface direction of internal electrodes 23 is parallel or substantially parallel to the mounting surface of substrate-type terminal 3. Further, when the first side surface or the second side surface of laminated capacitor 2 is used as the bottom surface which faces substrate-type terminal 3, the surface direction of internal electrodes 23 is perpendicular or substantially perpendicular to the mounting surface of substrate-type terminal 3.

Substrate-type terminal 3 includes a substrate main body 31, first and second component connection electrodes 32A, 32B, first and second external connection electrodes 33A, 33B, and first and second connection electrodes 34A, 34B. Substrate main body 31 includes a first main surface on which laminated capacitor 2 is to be mounted, and a second main surface opposite to the first main surface. That is, the first main surface of substrate main body 31 defines and serves as the mounting surface of substrate-type terminal 3. First and second component connection electrodes 32A, 32B are provided on the first main surface of substrate main body 31. First and second external connection electrodes 33A, 33B are provided on the second main surface of substrate main body 31.

Substrate main body 31 includes an insulating inorganic material as a main component. Substrate main body 31 preferably has a shape of a rectangular or substantially rectangular parallelepiped. Substrate main body 31 preferably has a thickness of more than or equal to about 0.05 mm and less than or equal to about 0.4 mm in a direction perpendicular or substantially perpendicular to the first main surface. Substrate main body 31 includes a first end surface and a second end surface which are perpendicular or substantially perpendicular to the first and second main surfaces of substrate main body 31 and extend along a shorter direction of substrate main body 31, and a first side surface and a second side surface which are perpendicular or substantially perpendicular to the first and second main surfaces of substrate main body 31 and extend along a longitudinal direction of substrate main body 31.

In the present preferred embodiment, the planar shape of substrate main body 31 is slightly smaller than the planar shape of laminated capacitor 2. For example, the dimensions of the planar shape of substrate main body 31 preferably are about 0.9 times the dimensions of the planar shape of laminated capacitor 2. As to the external dimensions of substrate main body 31, in consideration of attitude stability, the dimension of substrate main body 31 in the longitudinal direction is preferably more than or equal to about 0.8 times, more preferably more than or equal to about 0.9 times, the dimension (L) of laminated capacitor 2 in the longitudinal direction. Further, the dimension of substrate main body 31 in the shorter direction is preferably more than or equal to about 0.8 times, more preferably more than or equal to about 0.9 times, the dimension (W) of laminated capacitor 2 in the shorter direction. In addition, in consideration of the mounting area, the dimension of substrate main body 31 in the longitudinal direction is preferably less than or equal to about 2.0 times, more preferably less than or equal to about 1.5 times, the dimension (L) of laminated capacitor 2 in the longitudinal direction. Further, the dimension of substrate main body 31 in the shorter direction is preferably less than or equal to about 2.0 times, more preferably less than or equal to about 1.5 times, the dimension (W) of laminated capacitor 2 in the shorter direction.

First and second component connection electrodes 32A, 32B are arranged on the first main surface of substrate main body 31 to be aligned in the longitudinal direction of substrate main body 31. First component connection electrode 32A preferably is rectangular or substantially rectangular and located on the first end surface side of the first main surface of substrate main body 31. Second component connection electrode 32B preferably is rectangular or substantially rectangular and located on the second end surface side of the first main surface of substrate main body 31. First and second component connection electrodes 32A, 32B are connected to first and second external electrodes 22A, 22B of laminated capacitor 2, respectively. The joining method therefor is not particularly limited, and for example, first and second component connection electrodes 32A, 32B can be joined to first and second external electrodes 22A, 22B, respectively, by applying remeltable metal plating (for example, tin plating) beforehand to first and second component connection electrodes 32A, 32B or first and second external electrodes 22A, 22B, and thereafter remelting the metal plating. By using this joining method, a joining layer 41 made of the remelted metal plating is provided between first component connection electrode 32A and first external electrode 22A, and between second component connection electrode 32B and second external electrode 22B, and they are electrically and mechanically connected. Any other joining methods may be used, and for example, substrate-type terminal 3 may be joined to laminated capacitor 2 using a joining agent such as solder.

It is noted that the planar shape of first and second component connection electrodes 32A, 32B may be matched or substantially matched to the planar shape of first and second external electrodes 22A, 22B of laminated capacitor 2. In that case, laminated capacitor 2 is reliably mounted at a desired position due to a so-called self-alignment effect. By increasing the precision of the mounting position of laminated capacitor 2, laminated capacitor 2 is prevented from being misaligned toward one end surface or side surface of substrate-type terminal 3. As a result, first and second component connection electrodes 32A, 32B of substrate-type terminal 3 are uniformly arranged under first and second external electrodes 22A, 22B of laminated capacitor 2, respectively. This effectively prevents a joining agent from wetting up to end surfaces of first and second external electrodes 22A, 22B of laminated capacitor 2 when electronic component 1 is mounted on a circuit substrate 100.

First and second external connection electrodes 33A, 33B are arranged on the second main surface of substrate main body 31 to be aligned in the longitudinal direction of substrate main body 31. First external connection electrode 33A preferably is rectangular or substantially rectangular and located on the first end surface side of the second main surface of substrate main body 31. Second external connection electrode 33B preferably is rectangular or substantially rectangular and located on the second end surface side of the second main surface of substrate main body 31. It is noted that the shape of first and second external connection electrodes 33A, 33B may be set in accordance with the shape of mounting lands of the circuit substrate on which electronic component 1 is to be mounted.

First and second connection electrodes 34A, 34B are located on the first end surface and the second end surface of substrate main body 31, respectively. First connection electrode 34A is located on the first end surface, and establishes conduction between first component connection electrode 32A and first external connection electrode 33A. Second connection electrode 34B is located on the second end surface, and establishes conduction between second component connection electrode 32B and second external connection electrode 33B. First and second connection electrodes 34A, 34B may be located on at least one of the first side surface and the second side surface instead of the first end surface and the second end surface of substrate main body 31, and may be located on at least one of the first side surface and the second side surface in addition to the first end surface and the second end surface of substrate main body 31. Further, first and second connection electrodes 34A, 34B may be so-called via conductors provided in a shape penetrating substrate main body 31 in a thickness direction.

Figure 3A:
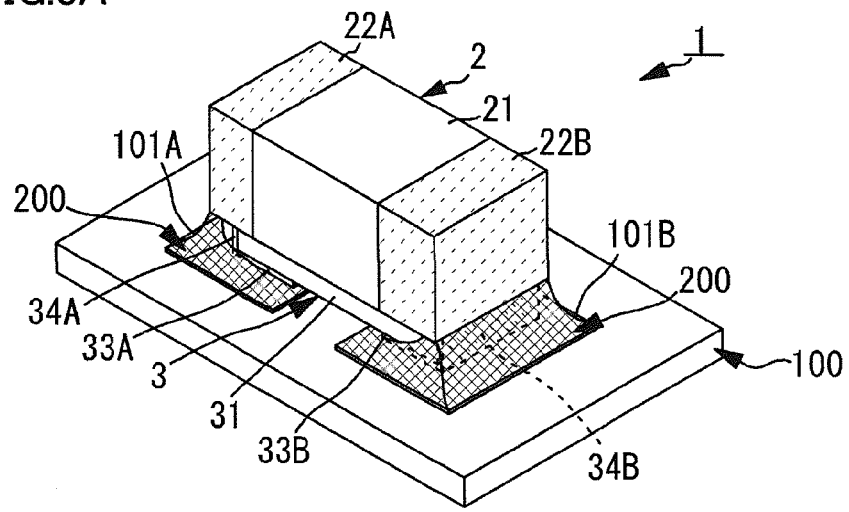
FIG. 3A is a perspective view showing a state where the electronic component in accordance with the first preferred embodiment of the present invention is mounted on a circuit substrate.
Figure 3B:
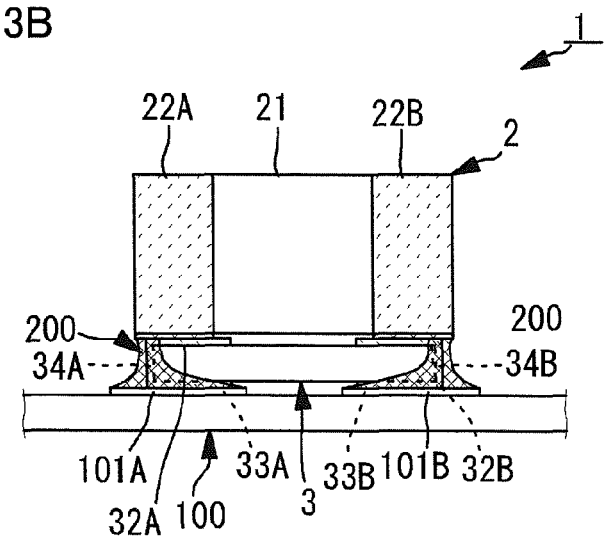
FIG. 3B is a front view showing the state where the electronic component in accordance with the first preferred embodiment of the present invention is mounted on the circuit substrate.
Figure 3C:
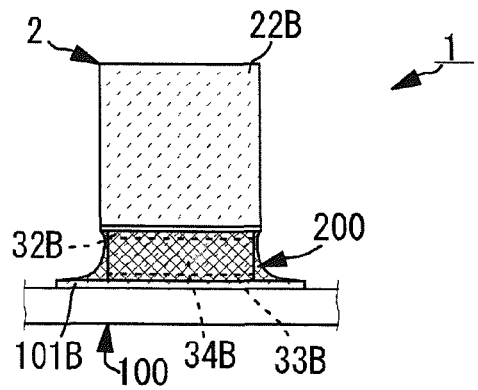
FIG. 3C is a right side view showing the state where the electronic component in accordance with the first preferred embodiment of the present invention is mounted on the circuit substrate.

FIG. 3A is a perspective view showing a state where the electronic component in accordance with the present preferred embodiment is mounted on a circuit substrate. FIG. 3B is a front view showing the state where the electronic component in accordance with the present preferred embodiment is mounted on the circuit substrate. FIG. 3C is a right side view showing the state where the electronic component in accordance with the present preferred embodiment is mounted on the circuit substrate.

As shown in FIGS. 3A to 3C, electronic component 1 is mounted on circuit substrate 100 using solder 200 as a joining agent. Circuit substrate 100 is provided with first and second mounting lands 101A, 101B having solder paste applied thereto. With first and second external connection electrodes 33A, 33B in electronic component 1 being brought into contact with first and second mounting lands 101A, 101B, respectively, the solder paste is melted and thereafter solidified. As a result, electronic component 1 is mounted on circuit substrate 100. When the solder paste is melted and thereafter solidified, melted solder 200 wets up first and second connection electrodes 34A, 34B in electronic component 1, forming fillets of solder 200.

The fillets of solder 200 are formed at least from first and second mounting lands 101A, 101B along first and second connection electrodes 34A, 34B. Therefore, electronic component 1 and circuit substrate 100 are joined with a sufficient joining strength. Further, floating of electronic component 1 from circuit substrate 100 is prevented. Furthermore, a junction defect is easily determined based on the shape of the fillets based on external appearance thereof. The joining agent is not limited to solder 200, and any joining agent may be used as long as it has an appropriate wettability and has conductivity.

If the supply amount of solder 200 is excessive, solder 200 may wet up to the first main surface side of substrate-type terminal 3, that is, to laminated capacitor 2. However, in the configuration of the present preferred embodiment, since a first end surface and a second end surface of substrate-type terminal 3 are disposed between a first end surface and a second end surface of laminated capacitor 2 as seen in a plan view, and respectively spaced relative to the first end surface and the second end surface of laminated capacitor 2, even if solder 200 reaches first and second external electrodes 22A, 22B, solder 200 is prevented from wetting up by the bottom surface of laminated capacitor 2.

Therefore, even if the supply amount of solder 200 is somewhat excessive, solder 200 hardly wets up to first and second external electrodes 22A, 22B provided at the first end surface and the second end surface of laminated capacitor 2, respectively. Thus, laminated capacitor 2 and circuit substrate 100 are substantially joined indirectly with substrate-type terminal 3 sandwiched therebetween.

In electronic component 1 mounted on circuit substrate 100 as described above, a slight distortion occurs in laminated capacitor 2 by applying voltage from first and second mounting lands 101A, 101B. The distortion in laminated capacitor 2 is transmitted to circuit substrate 100 through substrate-type terminal 3.

If the distortion in laminated capacitor 2 is transmitted to circuit substrate 100 with its magnitude (vibration amplitude) being kept constant or substantially constant, an audible sound may be generated in circuit substrate 100. Thus, in the present preferred embodiment, a material and a structure capable of reducing the vibration amplitude transmitted from laminated capacitor 2 are adopted for substrate-type terminal 3.

Figure 4:
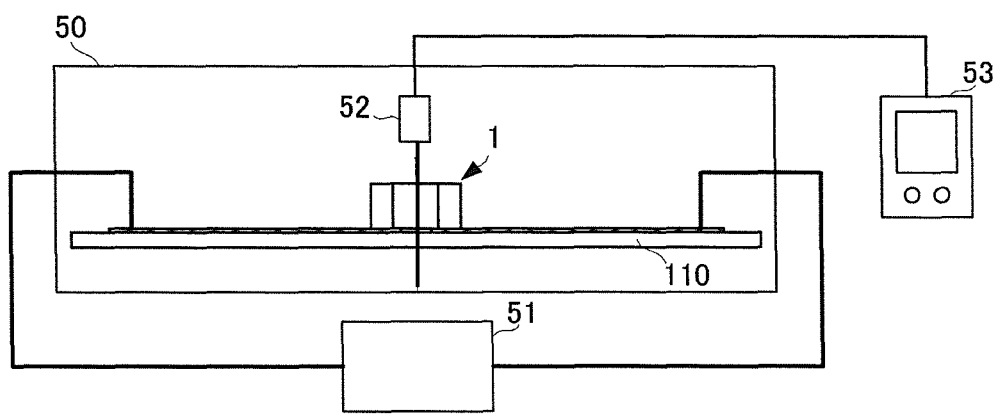
FIG. 4 is a configuration diagram of a sound pressure measuring device.

Specifically, the shape of and the material for substrate-type terminal 3 are determined based on an experimental result described below. Table 1 shows changes in the sound pressure of the audible sound generated from circuit substrate 100 in a case where the thickness and Young's modulus of substrate main body 31 are changed in substrate-type terminal 3. FIG. 4 is a configuration diagram of a sound pressure measuring device. The sound pressure shown in Table 1 is measured by the sound pressure measuring device shown in FIG. 4.

As shown in FIG. 4, an evaluation substrate 110 (corresponding to circuit substrate 100) on which electronic component 1 is mounted is accommodated in a non-resonating box 50. The sound pressure measuring device includes a power supply device 51 applying voltage from an electrode pattern to perform mounting located on evaluation substrate 110. The sound pressure measuring device also includes a microphone 52.

Microphone 52 is arranged immediately above electronic component 1 mounted on evaluation substrate 110 in non-resonating box 50, and collects sound pressure of evaluation substrate 110. Preferably, microphone 52 is arranged in the vicinity of the center of electronic component 1 in a longitudinal direction. Microphone 52 is arranged to be spaced apart from evaluation substrate 110 by about 3 mm. Microphone 52 is connected to an FFT analyzer 53 (CF-5220 manufactured by Ono Sokki Co., Ltd.) to detect sound pressure.

It is noted that Table 1 shows measurement results of sound pressure levels measured by applying an alternating current voltage of 1 Vpp at a direct current voltage of 4 V to electronic component 1.

Here, laminated capacitor 2 used in the sound pressure measurement experiment preferably has external dimensions of approximately 1.6 mm (length)×0.8 mm (width)×0.8 mm (thickness), and the main component of the material for the dielectric layers is barium titanate. Laminated capacitor 2 has a capacitance of about 10 µF, and internal electrodes 23 are perpendicular or substantially perpendicular to the mounting surface of substrate-type terminal 3. In substrate-type terminal 3, substrate main body 31 preferably has external dimensions of approximately 1.4 mm (length)×0.7 mm (width), and the thickness and Young's modulus of substrate main body 31 are parameters for the experiment. The thickness of substrate main body 31 preferably ranges from about 0.05 mm to about 0.4 mm, and the Young's modulus of substrate main body 31 is preferably set to any of about 20 GPa, about 100 GPa, about 200 GPa, about 300 GPa and about 400 GPa. Here, substrate main body 31 having a Young's modulus of about 20 GPa is conventional substrate main body 31 made of a glass epoxy resin, and substrate main body 31 having a Young's modulus of any of about 100 GPa, about 200 GPa, about 300 GPa, and about 400 GPa is substrate main body 31 formed by changing an additive amount of a glass component added to a ceramic substrate (main component: alumina).

TABLE 1

| Thickness | Young's Modulus | | | | |
|---|---|---|---|---|---|
| | 20 GPa | 100 GPa | 200 GPa | 300 GPa | 400 GPa |
| 0.05 mm | 65 dB | 64 dB | 64 dB | 63 dB | 62 dB |
| 0.10 mm | 63 dB | 60 dB | 59 dB | 57 dB | 54 dB |
| 0.15 mm | 60 dB | 58 dB | 55 dB | 51 dB | 47 dB |
| 0.20 mm | 58 dB | 55 dB | 51 dB | 45 dB | 41 dB |
| 0.30 mm | 53 dB | 46 dB | 30 dB | 33 dB | 38 dB |
| 0.40 mm | 47 dB | 23 dB | 41 dB | 42 dB | 43 dB |

Glass Epoxy Resin ↑    Ceramic ↑

As shown in Table 1, when comparison is made among substrate main bodies 31 having an equal thickness, the sound pressure level of the audible sound generated from circuit substrate 100 is lower in the ceramic substrates having Young's moduli of more than or equal to about 100 GPa and less than or equal to about 400 GPa than in the glass epoxy substrate having a Young's modulus of about 20 GPa. It has been confirmed from this result that generation of an audible sound from circuit substrate 100 on which electronic component 1 is mounted is significantly reduced or prevented by using an inorganic material substrate having a high Young's modulus as substrate main body 31, instead of a resin substrate.

Further, when determination is made based on a sound pressure level of about 65 dB, which is recognized as an unpleasant audible sound, the sound pressure level of the audible sound generated from circuit substrate 100 is always less than about 65 dB in the ceramic substrates having Young's moduli of more than or equal to about 100 GPa and less than or equal to about 400 GPa, among substrate main bodies 31 having thicknesses of more than or equal to about 0.05 mm and less than or equal to about 0.4 mm, for example.

In order to decrease the sound pressure level of the audible sound generated from circuit substrate 100 to less than or equal to about 60 dB to further reduce the audible sound, a ceramic substrate having a thickness of more than or equal to about 0.1 mm and less than or equal to about 0.4 mm and having a Young's modulus of more than or equal to about 100 GPa and less than or equal to about 400 GPa, for example, may preferably be used as substrate main body 31.

In order to decrease the sound pressure level of the audible sound generated from circuit substrate 100 to less than or equal to about 50 dB to further reduce the audible sound, a ceramic substrate having a thickness of more than or equal to about 0.3 mm and less than or equal to about 0.4 mm and having a Young's modulus of more than or equal to about 100 GPa and less than or equal to about 400 GPa, or a ceramic substrate having a thickness of more than or equal to about 0.2 mm and less than or equal to about 0.4 mm and having a Young's modulus of more than or equal to about 300 GPa and less than or equal to about 400 GPa, for example, may preferably be used as substrate main body 31.

Further, preferably, the Young's modulus of substrate main body 31 of substrate-type terminal 3 is higher than the Young's modulus of the dielectric material constituting the dielectric layers of laminate 21. In this case, when the same stress is applied to laminate 21 and substrate main body 31, substrate main body 31 having a higher Young's modulus has a smaller expansion/contraction amount than that of laminate 21. Therefore, transmission of vibration from laminated capacitor 2 to circuit substrate 100 through substrate-type terminal is significantly reduced or prevented, and the audible sound generated from circuit substrate 100 is significantly reduced or prevented. For example, barium titanate serving as the dielectric material in the present preferred embodiment preferably has a Young's modulus of about 70 GPa, and thus it is preferable also in this respect to set the Young's modulus of substrate main body 31 to more than or equal to about 100 GPa.

The inorganic material contained in substrate main body 31 includes, for example, alumina (having a Young's modulus of more than or equal to about 270 GPa and less than or equal to about 400 GPa). The Young's modulus of substrate main body 31 can be adjusted to a lower limit of about 80 GPa by adding a glass component to alumina. By adding a glass component, the Young's modulus of substrate main body 31 can be adjusted and the sintering temperature of ceramic can be reduced, facilitating manufacturing of substrate main body 31. Thus, substrate main body 31 having appropriate thickness and Young's modulus can be manufactured by adjusting a composition ratio among alumina, the glass component, and other additives. As a result, generation of an audible sound from circuit substrate 100 on which substrate main body 31 is mounted is significantly reduced or prevented, while significantly reducing the mounting height of electronic component 1.

As the inorganic material contained in substrate main body 31, silicon carbide (having a Young's modulus of more than or equal to about 400 GPa and less than or equal to about 480 GPa), carbonitride (having a Young's modulus of about 300 GPa), or zirconia (having a Young's modulus of more than or equal to about 150 GPa and less than or equal to about 250 GPa) can be used as appropriate, instead of alumina. Also in this case, substrate main body 31 having appropriate thickness and Young's modulus can be manufactured by adding an additive. As a result, generation of an audible sound from circuit substrate 100 on which substrate main body 31 is mounted is significantly reduced or prevented, while significantly reducing the mounting height of electronic component 1.

The sound pressure level of the audible sound generated by circuit substrate 100 also changes depending on whether internal electrodes 23 of laminated capacitor 2 are parallel or substantially parallel to or perpendicular or substantially perpendicular to the mounting surface of substrate-type terminal 3. Table 2 shows changes in the sound pressure of the audible sound generated from circuit substrate 100 in a case where internal electrodes 23 are parallel or substantially parallel to the mounting surface of substrate-type terminal 3 and in a case where internal electrodes 23 are perpendicular or substantially perpendicular to the mounting surface of substrate-type terminal 3.

Here, laminated capacitor 2 used in the sound pressure measurement experiment on the direction of internal electrodes 23 preferably has external dimensions of approximately 1.0 mm (length)×0.5 mm (width)×0.5 mm (thickness), and has a capacitance of about 1.0 μF. In substrate-type terminal 3, substrate main body 31 preferably has external dimensions of approximately 0.9 mm (length)×0.4 mm (width)×0.3 mm (thickness). Substrate main body 31 of one substrate-type terminal 3 is a glass epoxy substrate (having a Young's modulus of about 20 GPa), and substrate main body 31 of the other substrate-type terminal 3 is a ceramic substrate (having a Young's modulus of about 200 GPa).

TABLE 2

| Direction of Internal Electrodes | Glass Epoxy Resin Substrate | Ceramic Substrate |
| --- | --- | --- |
| Parallel or substantially parallel | 60 dB | 56 dB |
| Perpendicular or substantially perpendicular | 55 dB | 44 dB |

As can be seen from Table 2, both in the case where internal electrodes 23 are parallel or substantially parallel to the mounting surface of substrate-type terminal 3 and in the case where internal electrodes 23 are perpendicular or substantially perpendicular to the mounting surface of substrate-type terminal 3, the sound pressure level of the audible sound generated from circuit substrate 100 is lower in the ceramic substrate than in the glass epoxy resin substrate. Further, the sound pressure level of the audible sound generated from circuit substrate 100 is lower in the case where internal electrodes 23 are perpendicular or substantially perpendicular to the mounting surface of substrate-type terminal 3 than in the case where internal electrodes 23 are parallel or substantially parallel to the mounting surface of substrate-type terminal 3. Furthermore, in the ceramic substrate, the sound pressure level of the audible sound generated from circuit substrate 100 can be decreased to less than about 60 dB, and the sound pressure level of the audible sound generated from circuit substrate 100 can be further decreased to less than about 50 dB by causing internal electrodes 23 to be perpendicular or substantially perpendicular to the mounting surface of substrate-type terminal 3.

As described above, generation of an audible sound generated from circuit substrate 100 is significantly reduced or prevented by using a material having a high Young's modulus for substrate main body 31 of substrate-type terminal 3. Even if substrate main body 31 of substrate-type terminal 3 has a small thickness, that is, even if electronic component 1 has a low height, generation of an audible sound is significantly reduced or prevented more than in a conventional configuration.

In addition, generation of an audible sound generated from circuit substrate 100 is further significantly reduced or prevented by causing internal electrodes 23 of laminated capacitor 2 to be perpendicular or substantially perpendicular to the mounting surface of substrate-type terminal 3.

Figure 5A:
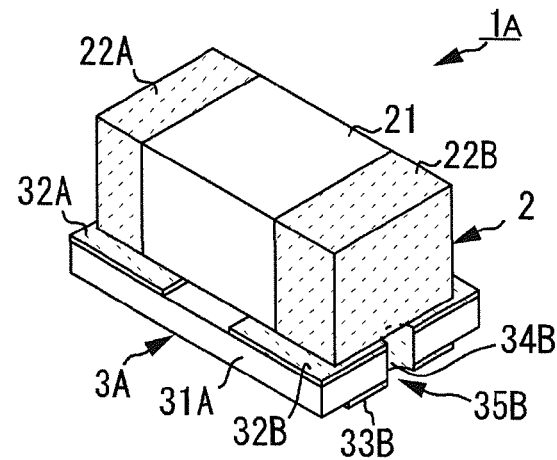
FIG. 5A is a perspective view showing an external appearance of an electronic component in accordance with a second preferred embodiment of the present invention.
Figure 5B:
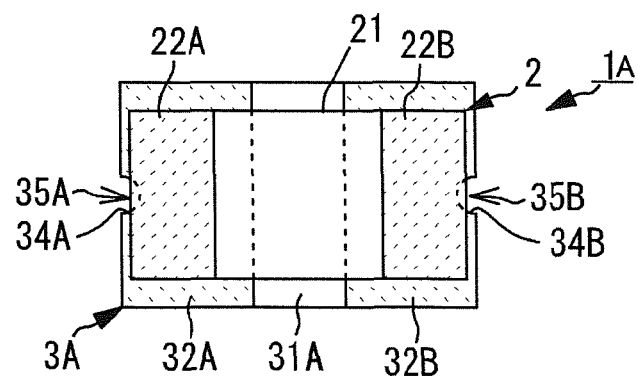
FIG. 5B is a plan view showing the external appearance of the electronic component in accordance with the second preferred embodiment of the present invention.
Figure 5C:
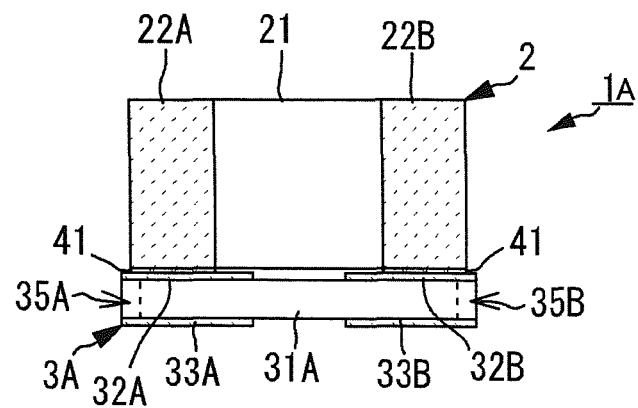
FIG. 5C is a front view showing the external appearance of the electronic component in accordance with the second preferred embodiment of the present invention.
Figure 5D:
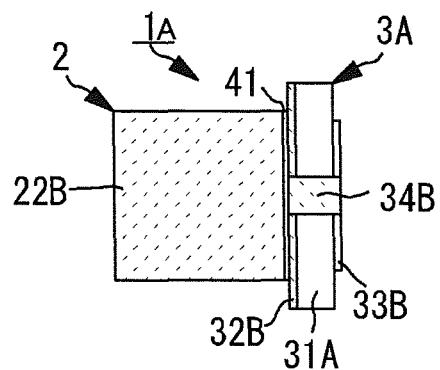
FIG. 5D is aright side view showing the external appearance of the electronic component in accordance with the same second preferred embodiment of the present invention.
Figure 5E:
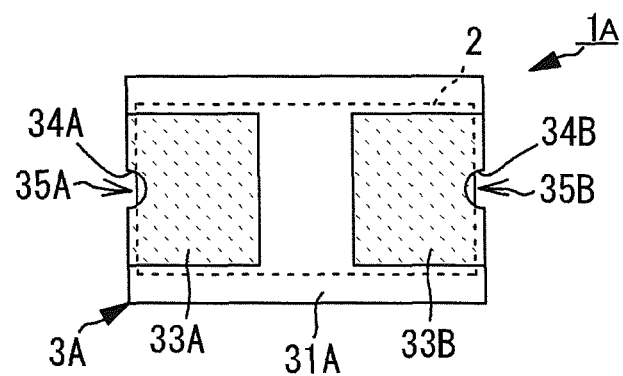
FIG. 5E is a bottom view showing the external appearance of the electronic component in accordance with the second preferred embodiment of the present invention.

Next, an electronic component in accordance with a second preferred embodiment of the present invention will be described with reference to the drawings. FIG. 5A is a perspective view showing an external appearance of the electronic component in accordance with the second preferred embodiment of the present invention. FIG. 5B is a plan view showing the external appearance of the electronic component in accordance with the present preferred embodiment. FIG. 5C is a front view showing the external appearance of the electronic component in accordance with the present preferred embodiment. FIG. 5D is a right side view showing the external appearance of the electronic component in accordance with the present preferred embodiment. FIG. 5E is a bottom view showing the external appearance of the electronic component in accordance with the present preferred embodiment.

Figure 6A:
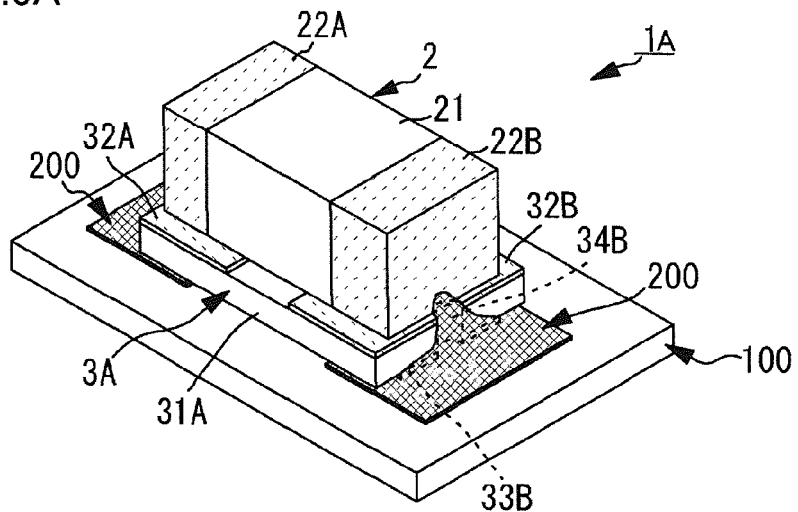
FIG. 6A is a perspective view showing a state where the electronic component in accordance with the second preferred embodiment of the present invention is mounted on a circuit substrate.
Figure 6B:
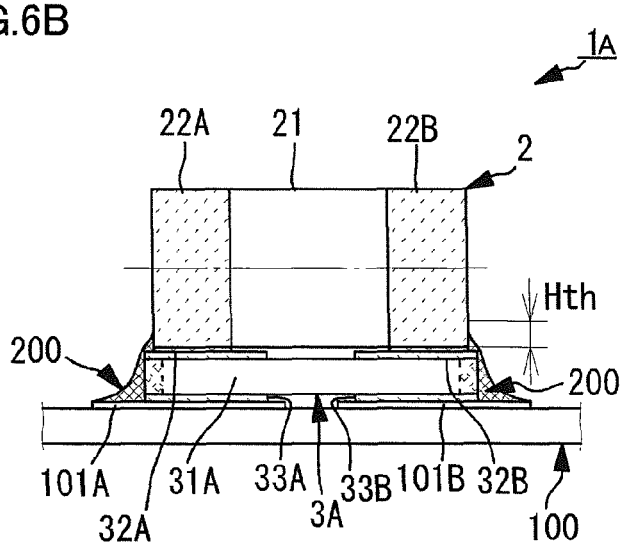
FIG. 6B is a front view showing the state where the electronic component in accordance with the second preferred embodiment of the present invention is mounted on the circuit substrate.
Figure 6C:
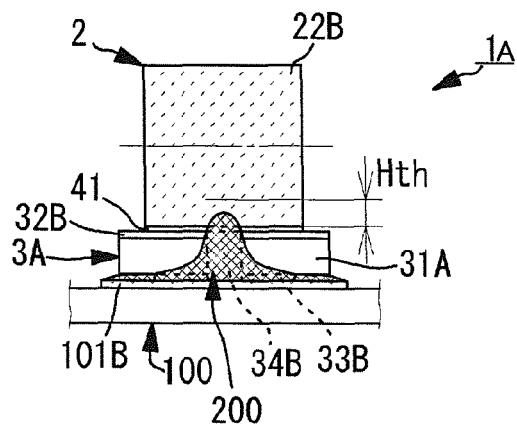
FIG. 6C is a right side view showing the state where the electronic component in accordance with the second preferred embodiment of the present invention is mounted on the circuit substrate.

FIG. 6A is a perspective view showing a state where the electronic component in accordance with the present preferred embodiment is mounted on a circuit substrate. FIG. 6B is a front view showing the state where the electronic component in accordance with the present preferred embodiment is mounted on the circuit substrate. FIG. 6C is a right side view showing the state where the electronic component in accordance with the present preferred embodiment is mounted on the circuit substrate.

Since an electronic component 1A in the present preferred embodiment is different from electronic component 1 in accordance with the first preferred embodiment only in the structure of a substrate-type terminal 3A, the description of other components will not be repeated.

As shown in FIGS. 5A to 5E and FIGS. 6A to 6C, the planar shape of a substrate main body 31A is slightly larger than the planar shape of laminated capacitor 2. For example, the dimensions of the planar shape of substrate main body 31A are set to be enlarged with a prescribed ratio with respect to the dimensions of the planar shape of laminated capacitor 2, or to protrude from the planar shape of laminated capacitor 2 by a prescribed length.

In substrate main body 31A, first and second groove portions 35A, 35B penetrating from a first main surface to a second main surface of substrate main body 31A are provided in a first end surface and a second end surface, respectively. First and second groove portions 35A, 35B preferably are arc-shaped or substantially arc-shaped as seen from a direction perpendicular or substantially perpendicular to the first main surface of substrate main body 31A. First and second groove portions 35A, 35B are arranged such that portions of first and second groove portions 35A, 35B are located under the bottom surface of laminated capacitor 2 when substrate main body 31A having laminated capacitor 2 arranged thereon is seen from the direction perpendicular or substantially perpendicular to the first main surface. Laminated capacitor 2 is mounted on substrate-type terminal 3 such that first and second external electrodes 22A, 22B of laminated capacitor 2 overlap with first and second groove portions 35A, 35B, respectively.

It is noted that first and second groove portions 35A, 35B may be provided in a first side surface and a second side surface of substrate main body 31A. In this case, in the description of the preferred embodiment below, the first end surface and the second end surface of laminated capacitor 2 can be translated into the first side surface and the second side surface of laminated capacitor 2.

First and second connection electrodes 34A, 34B are located on arc-shaped or substantially arc-shaped side wall surfaces of first and second groove portions 35A, 35B, respectively. First connection electrode 34A is located on the side wall surface of first groove portion 35A, and establishes conduction between first component connection electrode 32A and first external connection electrode 33A. Second connection electrode 34B is located on the side wall surface of second groove portion 35B, and establishes conduction between second component connection electrode 32B and second external connection electrode 33B.

In this configuration, even if the supply amount of solder 200 is excessive, solder 200 which wets up to the first main surface side of substrate-type terminal 3A is prevented from reaching first and second external electrodes 22A, 22B. Further, since first and second connection electrodes 34A, 34B are respectively located on the side wall surfaces of first and second groove portions 35A, 35B recessed under the bottom surface of laminated capacitor 2, wetting-up of solder 200 is prevented by the bottom surface of laminated capacitor 2 when solder 200 wets up substrate-type terminal 3A, and thus solder 200 is prevented from wetting up to the first main surface side of substrate-type terminal 3A.

Therefore, even if the supply amount of solder 200 is somewhat excessive, the amount of solder 200 which wets up to first and second external electrodes 22A, 22B provided at the first end surface and the second end surface of laminated capacitor 2, respectively, is significantly reduced. For example, when the amount of solder 200 is comparable to the amount used when laminated capacitor 2 is directly mounted on first and second mounting lands 101A, 101B, the height (Hth) of solder 200 which wets up to first and second external electrodes 22A, 22B can be limited to approximately ¼ to approximately ⅓, at most, from the bottom surface of laminated capacitor 2. Thus, laminated capacitor 2 and circuit substrate 100 are substantially joined indirectly with substrate-type terminal 3A sandwiched therebetween.

In addition, also in the configuration of the present preferred embodiment, the same function and effect can be obtained by determining the material for substrate main body 31A of substrate-type terminal 3A as in the first preferred embodiment.

Figure 7A:
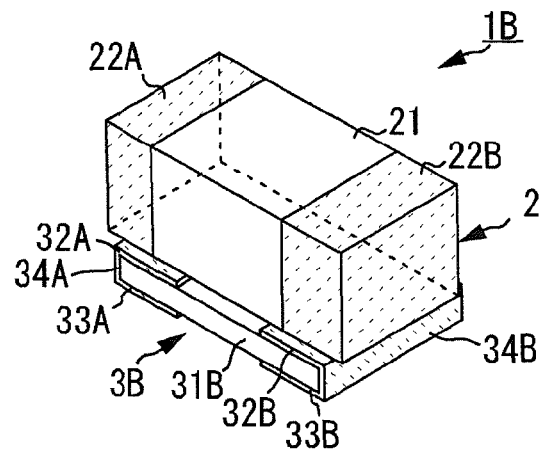
FIG. 7A is a perspective view showing an external appearance of an electronic component in accordance with a third preferred embodiment of the present invention.
Figure 7B:
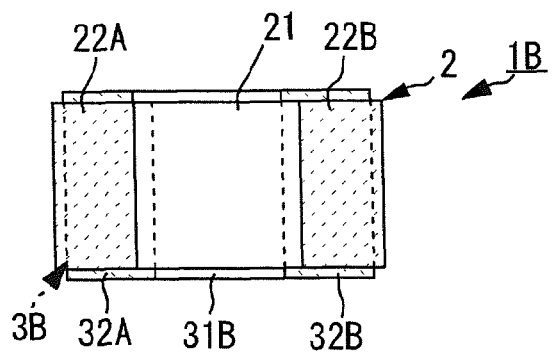
FIG. 7B is a plan view showing the external appearance of the electronic component in accordance with the third preferred embodiment of the present invention.
Figure 7C:
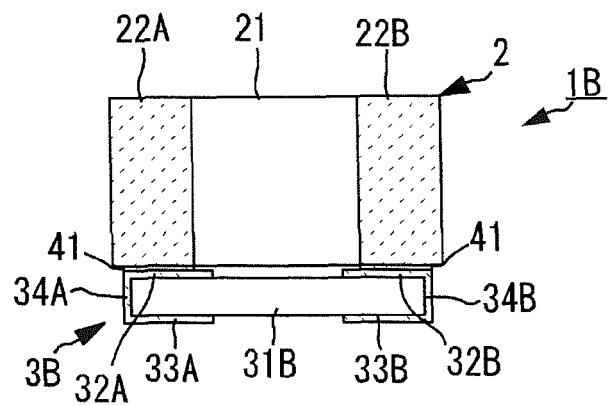
FIG. 7C is a front view showing the external appearance of the electronic component in accordance with the third preferred embodiment of the present invention.
Figure 7D:
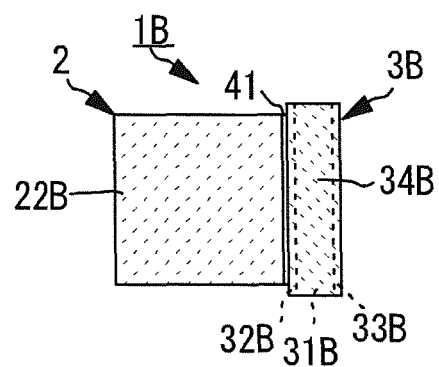
FIG. 7D is aright side view showing the external appearance of the electronic component in accordance with the third preferred embodiment of the present invention.
Figure 7E:
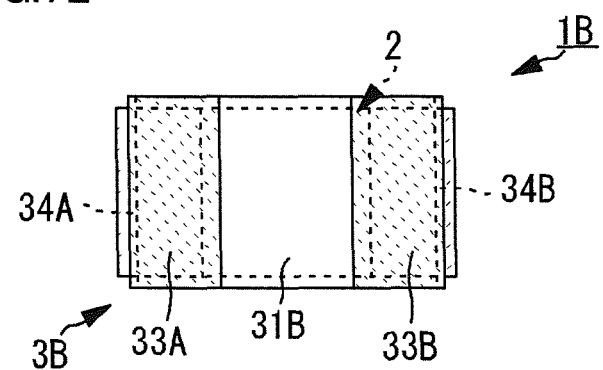
FIG. 7E is a bottom view showing the external appearance of the electronic component in accordance with the third preferred embodiment of the present invention.

Next, an electronic component in accordance with a third preferred embodiment of the present invention will be described with reference to the drawings. FIG. 7A is a perspective view showing an external appearance of the electronic component in accordance with the third preferred embodiment of the present invention. FIG. 7B is a plan view showing the external appearance of the electronic component in accordance with the present embodiment. FIG. 7C is a front view showing the external appearance of the electronic component in accordance with the present preferred embodiment. FIG. 7D is a right side view showing the external appearance of the electronic component in accordance with the present preferred embodiment. FIG. 7E is a bottom view showing the external appearance of the electronic component in accordance with the present preferred embodiment.

Since an electronic component 1B in the present preferred embodiment is different from electronic component 1 in accordance with the first preferred embodiment only in the structure of a substrate-type terminal 3B, the description of other components will not be repeated.

As shown in FIGS. 7A to 7E, the dimension of a substrate main body 31B in a longitudinal direction preferably is less than about 1.0 times the dimension (L) of laminated capacitor 2 in the longitudinal direction, and the dimension of substrate main body 31B in a shorter direction preferably is more than or equal to about 1.0 times the dimension (W) of laminated capacitor 2 in the shorter direction. In consideration of attitude stability, the dimension of substrate main body 31B in the longitudinal direction is preferably more than or equal to about 0.8 times, more preferably more than or equal to about 0.9 times, the dimension (L) of laminated capacitor 2 in the longitudinal direction. In addition, in consideration of the mounting area, the dimension of substrate main body 31B in the shorter direction is preferably less than or equal to about 2.0 times, more preferably less than or equal to about 1.5 times, the dimension (W) of laminated capacitor 2 in the shorter direction.

Substrate main body 31B is made of an epoxy resin containing glass, that is, a so-called glass epoxy resin. The material for substrate main body 31B is not limited thereto. Another resin can be used therefor, and another inorganic material can be used therefor.

If the supply amount of solder 200 is excessive, solder 200 may wet up to the first main surface side of substrate-type terminal 3B, that is, to laminated capacitor 2. However, in the configuration of the present preferred embodiment, since a first end surface and a second end surface of substrate-type terminal 3B are disposed between the first end surface and the second end surface of laminated capacitor 2 as seen in a plan view, and respectively spaced relative to the first end surface and the second end surface of laminated capacitor 2, even if solder 200 reaches first and second external electrodes 22A, 22B, solder 200 is prevented from wetting up by the bottom surface of laminated capacitor 2.

This significantly reduces or prevents vibration of the first end surface and the second end surface of laminated capacitor 2 from being transmitted to circuit substrate 100 through solder 200. Therefore, in circuit substrate 100 on which electronic component 1B is mounted, generation of an audible sound from circuit substrate 100 due to the vibration of the first end surface and the second end surface of laminated capacitor 2 is significantly reduced or prevented.

Further, since a force acting due to transmission of vibration is weakened by shortening an interval between the first end surface and the second end surface of substrate-type terminal 3B, that is, a section through which vibration is transmitted, generation of an audible sound from circuit substrate 100 on which electronic component 1B is mounted is significantly reduced or prevented.

Furthermore, since the configuration of the present preferred embodiment effectively prevents wetting-up of solder 200, an audible sound generated from circuit substrate 100 is significantly reduced or prevented even if the thickness of substrate-type terminal 3B is reduced. Preferably, substrate main body 31B of substrate-type terminal 3B has a thickness of more than or equal to about 0.05 mm and less than or equal to about 0.4 mm, for example.

In addition, also in the configuration of the present preferred embodiment, the same function and effect can be obtained by determining the material for substrate main body 31B of substrate-type terminal 3B as in the first preferred embodiment. For example, an audible sound generated from circuit substrate 100 is significantly reduced or prevented more effectively by using ceramic for substrate main body 31B and setting the Young's modulus thereof to more than or equal to about 100 GPa and less than or equal to about 400 GPa, for example.

Figure 8A:
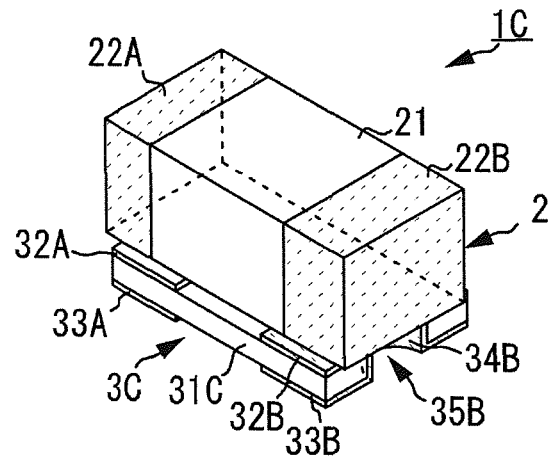
FIG. 8A is a perspective view showing an external appearance of an electronic component in accordance with a fourth preferred embodiment of the present invention.
Figure 8B:
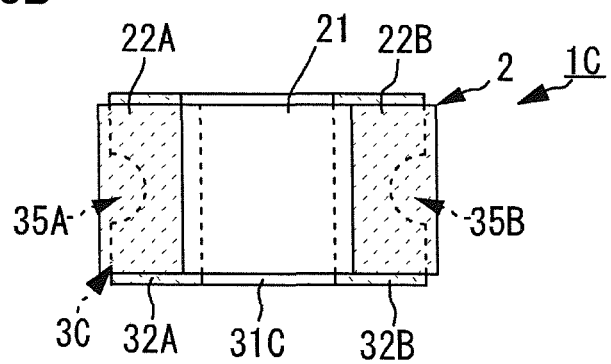
FIG. 8B is a plan view showing the external appearance of the electronic component in accordance with the fourth preferred embodiment of the present invention.
Figure 8C:
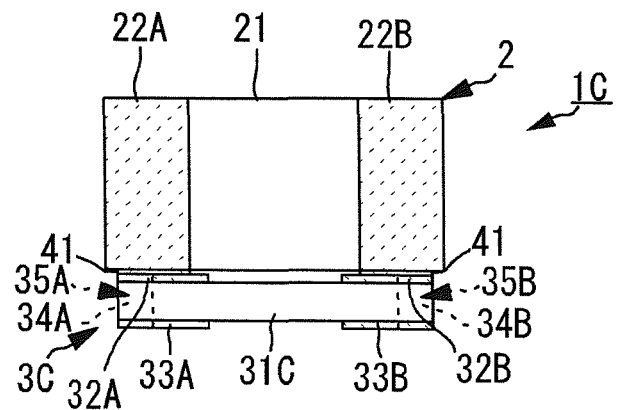
FIG. 8C is a front view showing the external appearance of the electronic component in accordance with the fourth preferred embodiment of the present invention.
Figure 8D:
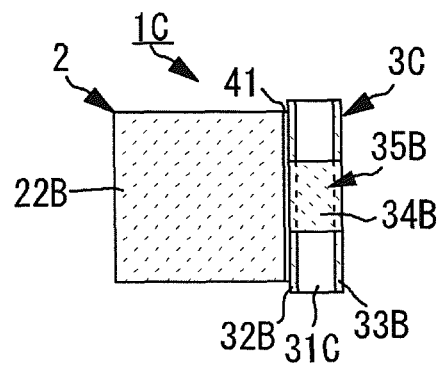
FIG. 8D is aright side view showing the external appearance of the electronic component in accordance with the fourth preferred embodiment of the present invention.
Figure 8E:
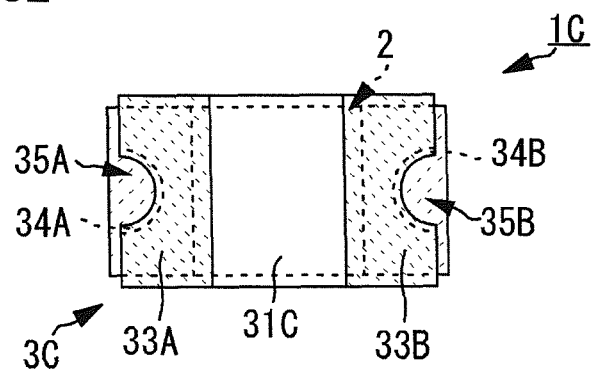
FIG. 8E is a bottom view showing the external appearance of the electronic component in accordance with the fourth preferred embodiment of the present invention.

Next, an electronic component in accordance with a fourth preferred embodiment of the present invention will be described with reference to the drawings. FIG. 8A is a perspective view showing an external appearance of the electronic component in accordance with the fourth preferred embodiment of the present invention. FIG. 8B is a plan view showing the external appearance of the electronic component in accordance with the present preferred embodiment. FIG. 8C is a front view showing the external appearance of the electronic component in accordance with the present preferred embodiment. FIG. 8D is a right side view showing the external appearance of the electronic component in accordance with the present preferred embodiment. FIG. 8E is a bottom view showing the external appearance of the electronic component in accordance with the present preferred embodiment.

Since an electronic component 1C in the present preferred embodiment is different from electronic component 1B in accordance with the third preferred embodiment only in that a substrate-type terminal is provided with groove portions, the description of other components will not be repeated.

As shown in FIGS. 8A to 8E, in a substrate main body 31C, first and second groove portions 35A, 35B penetrating from a first main surface to a second main surface of substrate main body 31C are provided in a first end surface and a second end surface, respectively. First and second groove portions 35A, 35B are arc-shaped or substantially arc-shaped as seen from a direction perpendicular or substantially perpendicular to the first main surface of substrate main body 31C. First and second groove portions 35A, 35B are arranged such that all of first and second groove portions 35A, 35B are located under the bottom surface of laminated capacitor 2 when substrate main body 31C having laminated capacitor 2 arranged thereon is seen from the direction perpendicular or substantially perpendicular to the first main surface. Laminated capacitor 2 is mounted on substrate-type terminal 3C such that first and second external electrodes 22A, 22B of laminated capacitor 2 overlap with first and second groove portions 35A, 35B, respectively.

First and second connection electrodes 34A, 34B are located on arc-shaped or substantially arc-shaped side wall surfaces of first and second groove portions 35A, 35B, respectively. First connection electrode 34A is located on the side wall surface of first groove portion 35A, and establishes conduction between first component connection electrode 32A and first external connection electrode 33A. Second connection electrode 34B is located on the side wall surface of second groove portion 35B, and establishes conduction between second component connection electrode 32B and second external connection electrode 33B.

In the configuration of the present preferred embodiment, first and second connection electrodes 34A, 34B are located on the side wall surfaces of first and second groove portions 35A, 35B, respectively. Accordingly, in comparison with electronic component 1B in accordance with the third preferred embodiment, at least portions of first and second connection electrodes 34A, 34B are widely spaced relative to the first end surface and the second end surface of laminated capacitor 2, respectively, and thus wetting-up is further prevented by the bottom surface of laminated capacitor 2. Further, since a force acting due to transmission of vibration is weakened by shortening an interval between first groove portion 35A and second groove portion 35B in substrate-type terminal 3C, that is, a section through which vibration is transmitted, generation of an audible sound from circuit substrate 100 on which electronic component 1C is mounted is significantly reduced or prevented.

Furthermore, in the configuration of the present preferred embodiment, even if there is a deviation in the position of mounting laminated capacitor 2 on substrate-type terminal 3C and an end surface of substrate-type terminal 3C protrudes from an end surface of laminated capacitor 2 when substrate main body 31C having laminated capacitor 2 arranged thereon is seen from the direction perpendicular or substantially perpendicular to the first main surface, portions of first and second connection electrodes 34A, 34B can be located under the bottom surface of laminated capacitor 2, because first and second connection electrodes 34A, 34B are located on the side wall surfaces of first and second groove portions 35A, 35B, respectively. Therefore, wetting-up of solder 200 is significantly reduced or prevented by the bottom surface of laminated capacitor 2.

Preferably, the at least portions of first and second connection electrodes 34A, 34B are spaced from the end surfaces of substrate-type terminal 3C by a prescribed distance or more, to cause the at least portions of first and second connection electrodes 34A, 34B to be widely spaced relative to the first end surface and the second end surface of laminated capacitor 2, respectively.

First and second groove portions 35A, 35B may be provided on at least one of a first side surface and a second side surface instead of the first end surface and the second end surface of substrate main body 31C, and may be provided on at least one of the first side surface and the second side surface in addition to the first end surface and the second end surface of substrate main body 31C. First and second groove portions 35A, 35B may also be provided at corner portions of substrate main body 31C. Also in these cases, wetting-up of solder 200 is prevented by the bottom surface of laminated capacitor 2 in first and second groove portions 35A, 35B, and generation of an audible sound from circuit substrate 100 is significantly reduced or prevented.

Figure 9A:
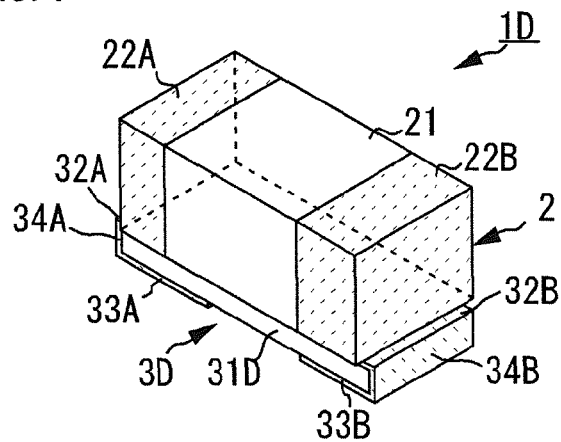
FIG. 9A is a perspective view showing an external appearance of an electronic component in accordance with a fifth preferred embodiment of the present invention.
Figure 9B:
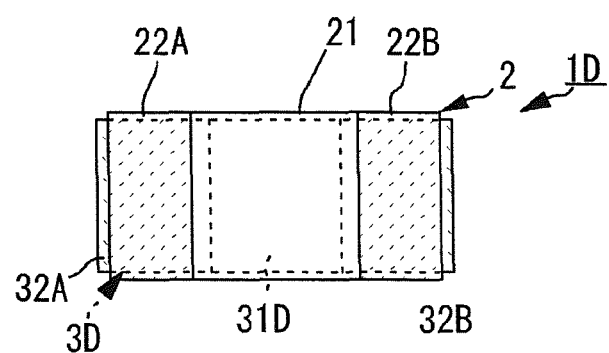
FIG. 9B is a plan view showing the external appearance of the electronic component in accordance with the fifth preferred embodiment of the present invention.
Figure 9C:
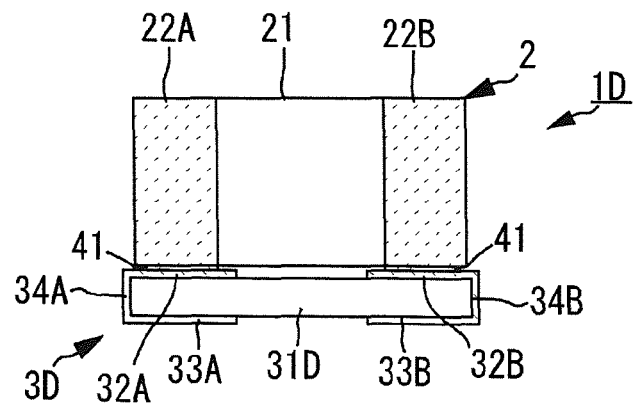
FIG. 9C is a front view showing the external appearance of the electronic component in accordance with the fifth preferred embodiment of the present invention.
Figure 9D:
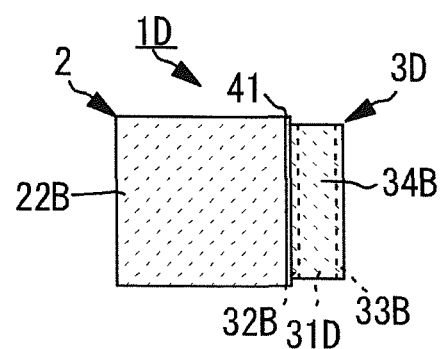
FIG. 9D is aright side view showing the external appearance of the electronic component in accordance with the fifth preferred embodiment of the present invention.
Figure 9E:
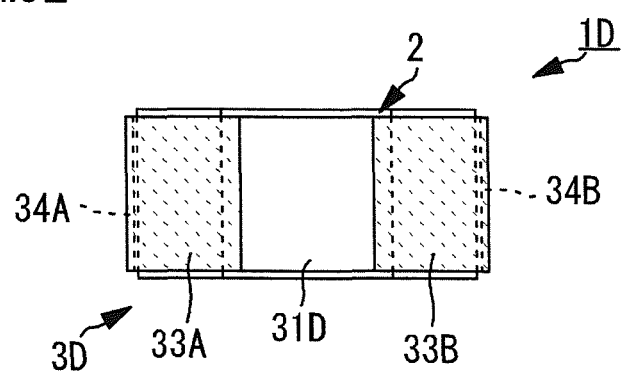
FIG. 9E is a bottom view showing the external appearance of the electronic component in accordance with the fifth preferred embodiment of the present invention.

Next, an electronic component in accordance with a fifth preferred embodiment of the present invention will be described with reference to the drawings. FIG. 9A is a perspective view showing an external appearance of the electronic component in accordance with the fifth preferred embodiment of the present invention. FIG. 9B is a plan view showing the external appearance of the electronic component in accordance with the present preferred embodiment. FIG. 9C is a front view showing the external appearance of the electronic component in accordance with the present preferred embodiment. FIG. 9D is a right side view showing the external appearance of the electronic component in accordance with the present preferred embodiment. FIG. 9E is a bottom view showing the external appearance of the electronic component in accordance with the present preferred embodiment.

Since an electronic component 1D in the present preferred embodiment is different from electronic component 1 in accordance with the first preferred embodiment only in the structure of a substrate-type terminal 3D, the description of other components will not be repeated.

As shown in FIGS. 9A to 9E, the dimension of a substrate main body 31D in a longitudinal direction preferably is more than or equal to about 1.0 times the dimension (L) of laminated capacitor 2 in the longitudinal direction, and the dimension of substrate main body 31D in a shorter direction preferably is less than about 1.0 times the dimension (W) of laminated capacitor 2 in the shorter direction. In consideration of attitude stability, the dimension of substrate main body 31D in the shorter direction is preferably more than or equal to about 0.8 times, more preferably more than or equal to about 0.9 times, the dimension (W) of laminated capacitor 2 in the shorter direction. In addition, in consideration of the mounting area, the dimension of substrate main body 31D in the longitudinal direction is preferably less than or equal to about 2.0 times, more preferably less than or equal to about 1.5 times, the dimension (L) of laminated capacitor 2 in the longitudinal direction, for example.

Substrate main body 31D preferably is made of an epoxy resin containing glass, that is, a so-called glass epoxy resin. The material for substrate main body 31D is not limited thereto. Another resin can be used therefor, and another inorganic material can be used therefor.

If the supply amount of solder 200 is excessive, solder 200 may wet up to the first main surface side of substrate-type terminal 3D, that is, to laminated capacitor 2. However, in the configuration of the present preferred embodiment, since a first side surface and a second side surface of substrate-type terminal 3D are disposed between the first side surface and the second side surface of laminated capacitor 2 as seen in a plan view, and respectively spaced relative to the first side surface and the second side surface of laminated capacitor 2, even if solder 200 reaches first and second external electrodes 22A, 22B, solder 200 is prevented from wetting up by the bottom surface of laminated capacitor 2.

This prevents vibration of the first side surface and the second side surface of laminated capacitor 2 from being transmitted to circuit substrate 100 through solder 200. Therefore, in circuit substrate 100 on which electronic component 1D is mounted, generation of an audible sound from circuit substrate 100 due to the vibration of the first side surface and the second side surface of laminated capacitor 2 is significantly reduced or prevented.

Further, since a force acting due to transmission of vibration can be weakened by shortening an interval between the first side surface and the second side surface of substrate-type terminal 3D, that is, a section through which vibration is transmitted, generation of an audible sound from circuit substrate 100 on which electronic component 1D is mounted is significantly reduced or prevented.

Furthermore, since the configuration of the present preferred embodiment effectively prevents wetting-up of solder 200, an audible sound generated from circuit substrate 100 is significantly reduced or prevented even if the thickness of substrate-type terminal 3D is reduced. Preferably, substrate main body 31D of substrate-type terminal 3D has a thickness of more than or equal to about 0.05 mm and less than or equal to about 0.4 mm, for example.

In addition, also in the configuration of the present preferred embodiment, the same function and effect can be obtained by determining the material for substrate main body 31D of substrate-type terminal 3D as in the first preferred embodiment. For example, an audible sound generated from circuit substrate 100 is significantly reduced or prevented more effectively by using ceramic for substrate main body 31D and setting the Young's modulus thereof to more than or equal to about 100 GPa and less than or equal to about 400 GPa, for example.

Figure 10A:
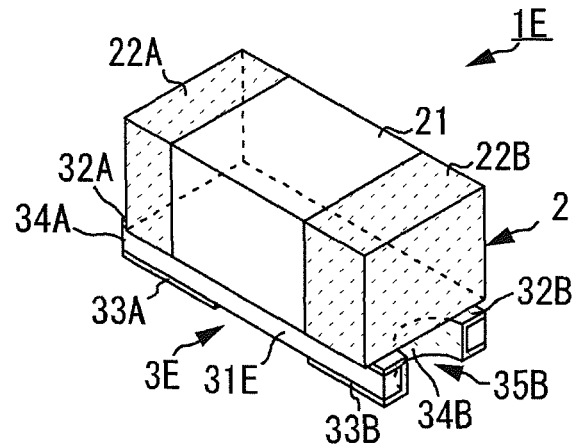
FIG. 10A is a perspective view showing an external appearance of an electronic component in accordance with a sixth preferred embodiment of the present invention.
Figure 10B:
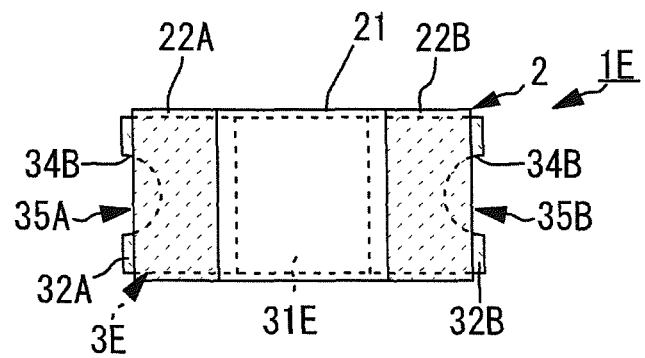
FIG. 10B is a plan view showing the external appearance of the electronic component in accordance with the sixth preferred embodiment of the present invention.
Figure 10C:
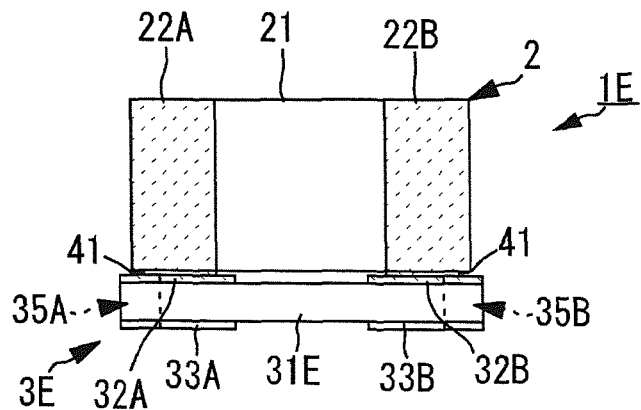
FIG. 10C is a front view showing the external appearance of the electronic component in accordance with the sixth preferred embodiment of the present invention.
Figure 10D:
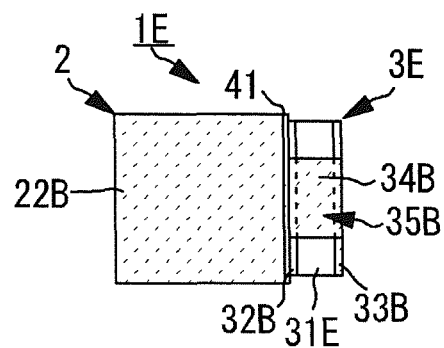
FIG. 10D is a right side view showing the external appearance of the electronic component in accordance with the sixth preferred embodiment of the present invention.
Figure 10E:
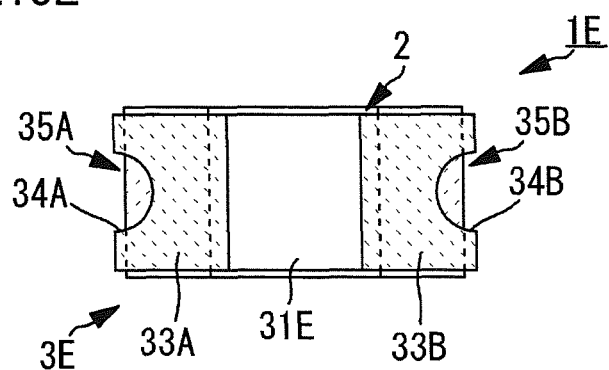
FIG. 10E is a bottom view showing the external appearance of the electronic component in accordance with the sixth preferred embodiment of the present invention.

Next, an electronic component in accordance with a sixth preferred embodiment of the present invention will be described with reference to the drawings. FIG. 10A is a perspective view showing an external appearance of the electronic component in accordance with the sixth preferred embodiment of the present invention. FIG. 10B is a plan view showing the external appearance of the electronic component in accordance with the present preferred embodiment. FIG. 10C is a front view showing the external appearance of the electronic component in accordance with the present preferred embodiment. FIG. 10D is a right side view showing the external appearance of the electronic component in accordance with the present preferred embodiment. FIG. 10E is a bottom view showing the external appearance of the electronic component in accordance with the present preferred embodiment.

Since an electronic component 1E in the present preferred embodiment is different from electronic component 1D in accordance with the fifth preferred embodiment only in that a substrate-type terminal 3E is provided with groove portions, the description of other components will not be repeated.

As shown in FIGS. 10A to 10E, in a substrate main body 31E, first and second groove portions 35A, 35B penetrating from a first main surface to a second main surface of substrate main body 31E are provided in a first end surface and a second end surface, respectively. First and second groove portions 35A, 35B are arc-shaped or substantially arc-shaped as seen from a direction perpendicular or substantially perpendicular to the first main surface of substrate main body 31E. First and second groove portions 35A, 35B are arranged such that portions of first and second groove portions 35A, 35B are located under the bottom surface of laminated capacitor 2 when substrate main body 31E having laminated capacitor 2 arranged thereon is seen from the direction perpendicular or substantially perpendicular to the first main surface. Laminated capacitor 2 is mounted on substrate-type terminal 3E such that first and second external electrodes 22A, 22B of laminated capacitor 2 overlap with first and second groove portions 35A, 35B, respectively.

First and second connection electrodes 34A, 34B are located on arc-shaped or substantially arc-shaped side wall surfaces of first and second groove portions 35A, 35B, respectively. First connection electrode 34A is located on the side wall surface of first groove portion 35A, and establishes conduction between first component connection electrode 32A and first external connection electrode 33A. Second connection electrode 34B is located on the side wall surface of second groove portion 35B, and establishes conduction between second component connection electrode 32B and second external connection electrode 33B.

In the configuration of the present preferred embodiment, first and second connection electrodes 34A, 34B are located on the side wall surfaces of first and second groove portions 35A, 35B, respectively. Accordingly, in comparison with electronic component 1D in accordance with the fifth preferred embodiment, at least portions of first and second connection electrodes 34A, 34B are widely spaced relative to the first end surface and the second end surface of laminated capacitor 2, respectively, and thus wetting-up is further prevent by the bottom surface of laminated capacitor 2. Further, since a force acting due to transmission of vibration is weakened by shortening an interval between first groove portion 35A and second groove portion 35B in substrate-type terminal 3E, that is, a section through which vibration is transmitted, generation of an audible sound from circuit substrate 100 on which electronic component 1E is mounted is significantly reduced or prevented.

Furthermore, in the configuration of the present preferred embodiment, even if there is a deviation in the position of mounting laminated capacitor 2 on substrate-type terminal 3E when substrate main body 31E having laminated capacitor 2 arranged thereon is seen from the direction perpendicular or substantially perpendicular to the first main surface, portions of first and second connection electrodes 34A, 34B can be located under the bottom surface of laminated capacitor 2, because first and second connection electrodes 34A, 34B are located on the side wall surfaces of first and second groove portions 35A, 35B, respectively. Therefore, wetting-up of solder 200 is prevented by the bottom surface of laminated capacitor 2.

Preferably, the at least portions of first and second connection electrodes 34A, 34B are spaced from the end surfaces of substrate-type terminal 3E by a prescribed distance or more, to cause the at least portions of first and second connection electrodes 34A, 34B to be widely spaced relative to the first end surface and the second end surface of laminated capacitor 2, respectively.

First and second groove portions 35A, 35B may be located on at least one of a first side surface and a second side surface instead of the first end surface and the second end surface of substrate main body 31E, and may be located on at least one of the first side surface and the second side surface in addition to the first end surface and the second end surface of substrate main body 31E. First and second groove portions 35A, 35B may also be located at corner portions of substrate main body 31E. Also in these cases, wetting-up of solder 200 is prevented by the bottom surface of laminated capacitor 2 in first and second groove portions 35A, 35B, and generation of an audible sound from circuit substrate 100 is significantly reduced or prevented.

Figure 11A:
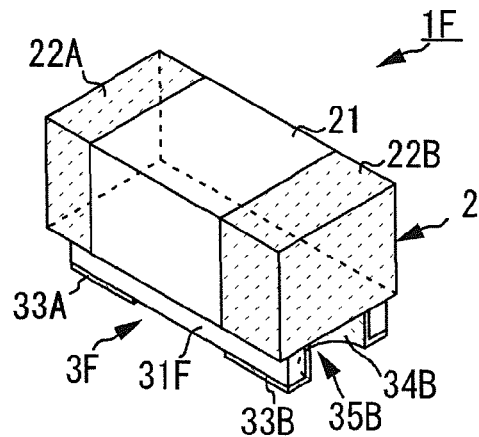
FIG. 11A is a perspective view showing an external appearance of an electronic component in accordance with a seventh preferred embodiment of the present invention.
Figure 11B:
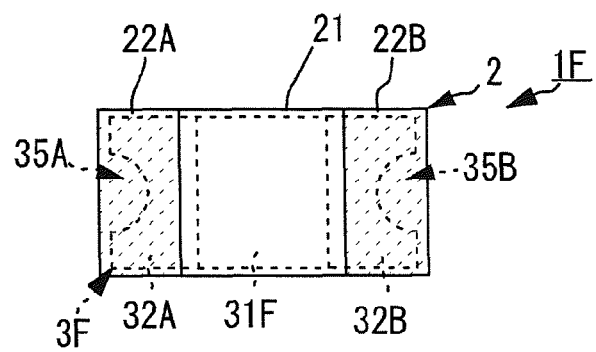
FIG. 11B is a plan view showing the external appearance of the electronic component in accordance with the seventh preferred embodiment of the present invention.
Figure 11C:
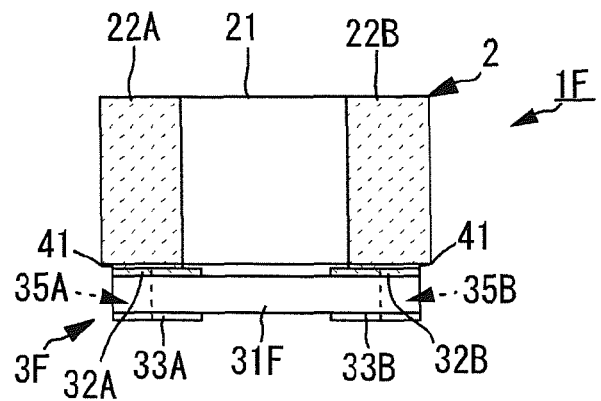
FIG. 11C is a front view showing the external appearance of the electronic component in accordance with the seventh preferred embodiment of the present invention.
Figure 11D:
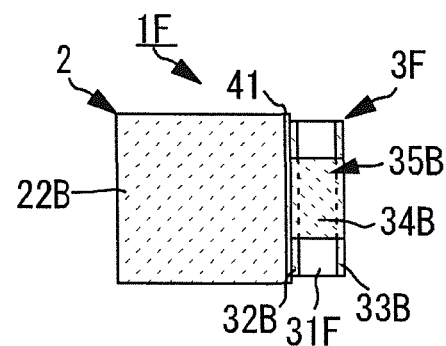
FIG. 11D is a right side view showing the external appearance of the electronic component in accordance with the seventh preferred embodiment of the present invention.
Figure 11E:
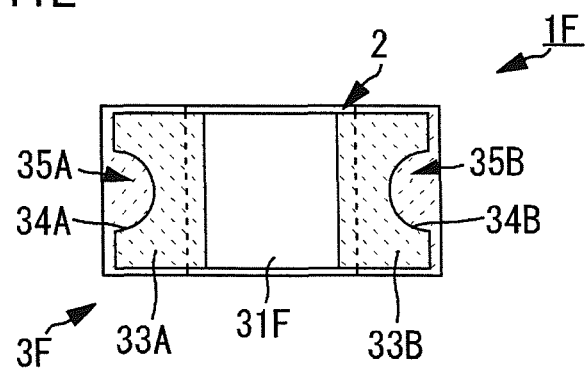
FIG. 11E is a bottom view showing the external appearance of the electronic component in accordance with the seventh preferred embodiment of the present invention.

Next, an electronic component in accordance with a seventh preferred embodiment of the present invention will be described with reference to the drawings. FIG. 11A is a perspective view showing an external appearance of the electronic component in accordance with the seventh preferred embodiment of the present invention. FIG. 11B is a plan view showing the external appearance of the electronic component in accordance with the present preferred embodiment. FIG. 11C is a front view showing the external appearance of the electronic component in accordance with the present preferred embodiment. FIG. 11D is a right side view showing the external appearance of the electronic component in accordance with the present preferred embodiment. FIG. 11E is a bottom view showing the external appearance of the electronic component in accordance with the present preferred embodiment.

Since an electronic component 1F in the present preferred embodiment is different from electronic component 1 in accordance with the first preferred embodiment only in the structure of a substrate-type terminal 3F, the description of other components will not be repeated.

As shown in FIGS. 11A to 11E, the dimension of a substrate main body 31F in a longitudinal direction preferably is less than about 1.0 times the dimension (L) of laminated capacitor 2 in the longitudinal direction, and the dimension of substrate main body 31F in a shorter direction preferably is less than about 1.0 times the dimension (W) of laminated capacitor 2 in the shorter direction, for example. In consideration of attitude stability, the dimension of substrate main body 31F in the longitudinal direction is preferably more than or equal to about 0.8 times, more preferably more than or equal to about 0.9 times, the dimension (L) of laminated capacitor 2 in the longitudinal direction, for example. The dimension of substrate main body 31F in the shorter direction is preferably more than or equal to about 0.8 times, more preferably more than or equal to about 0.9 times, the dimension (W) of laminated capacitor 2 in the shorter direction, for example.

In substrate main body 31F, first and second groove portions 35A, 35B penetrating from a first main surface to a second main surface of substrate main body 31F are provided in a first end surface and a second end surface, respectively. First and second groove portions 35A, 35B are arc-shaped or substantially arc-shaped as seen from a direction perpendicular or substantially perpendicular to the first main surface of substrate main body 31F. First and second groove portions 35A, 35B are arranged such that all of first and second groove portions 35A, 35B are located under the bottom surface of laminated capacitor 2 when substrate main body 31F having laminated capacitor 2 arranged thereon is seen from the direction perpendicular or substantially perpendicular to the first main surface. Laminated capacitor 2 is mounted on substrate-type terminal 3F such that first and second external electrodes 22A, 22B of laminated capacitor 2 overlap with first and second groove portions 35A, 35B, respectively.

First and second connection electrodes 34A, 34B are located on arc-shaped or substantially arc-shaped side wall surfaces of first and second groove portions 35A, 35B, respectively. First connection electrode 34A is located on the side wall surface of first groove portion 35A, and establishes conduction between first component connection electrode 32A and first external connection electrode 33A. Second connection electrode 34B is located on the side wall surface of second groove portion 35B, and establishes conduction between second component connection electrode 32B and second external connection electrode 33B.

In the configuration of the present preferred embodiment, first and second connection electrodes 34A, 34B are located on the side wall surfaces of first and second groove portions 35A, 35B, respectively. Accordingly, in comparison with electronic component 1E in accordance with the sixth preferred embodiment, at least portions of first and second connection electrodes 34A, 34B are widely spaced relative to the first end surface and the second end surface of laminated capacitor 2, respectively, and thus wetting-up is further prevented by the bottom surface of laminated capacitor 2. Further, since a force acting due to transmission of vibration is weakened by shortening an interval between first groove portion 35A and second groove portion 35B in substrate-type terminal 3F, that is, a section through which vibration is transmitted, generation of an audible sound from circuit substrate 100 on which electronic component 1F is mounted is significantly reduced or prevented.

Furthermore, in the configuration of the present preferred embodiment, even if there is a deviation in the position of mounting laminated capacitor 2 on substrate-type terminal 3F and an end surface of substrate-type terminal 3F protrudes from an end surface of laminated capacitor 2 when substrate main body 31F having laminated capacitor 2 arranged thereon is seen from the direction perpendicular or substantially perpendicular to the first main surface, portions of first and second connection electrodes 34A, 34B can be located under the bottom surface of laminated capacitor 2, because first and second connection electrodes 34A, 34B are located on the side wall surfaces of first and second groove portions 35A, 35B, respectively. Therefore, wetting-up of solder 200 is prevented by the bottom surface of laminated capacitor 2.

Preferably, the at least portions of first and second connection electrodes 34A, 34B are spaced from the end surfaces of substrate-type terminal 3F by a prescribed distance or more, to cause the at least portions of first and second connection electrodes 34A, 34B to be widely spaced relative to the first end surface and the second end surface of laminated capacitor 2, respectively.

First and second groove portions 35A, 35B may be located on at least one of a first side surface and a second side surface instead of the first end surface and the second end surface of substrate main body 31F, and may be located on at least one of the first side surface and the second side surface in addition to the first end surface and the second end surface of substrate main body 31F. First and second groove portions 35A, 35B may also be located at corner portions of substrate main body 31F. Also in these cases, wetting-up of solder 200 is prevented by the bottom surface of laminated capacitor 2 in first and second groove portions 35A, 35B, and generation of an audible sound from circuit substrate 100 is significantly reduced or prevented.

The electronic component having the configuration described in each of the preferred embodiments described above is fed to a manufacturing process using the electronic component, in a state accommodated in a carrier tape described below.

Figure 12A:
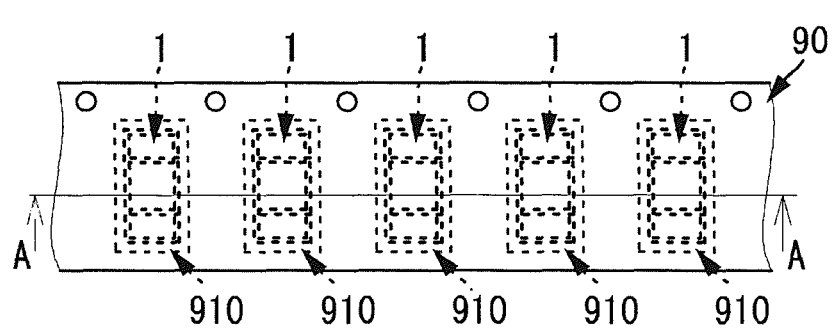
FIG. 12A is a plan view showing a configuration of an electronic component package in accordance with an eighth preferred embodiment of the present invention.
Figure 12B:
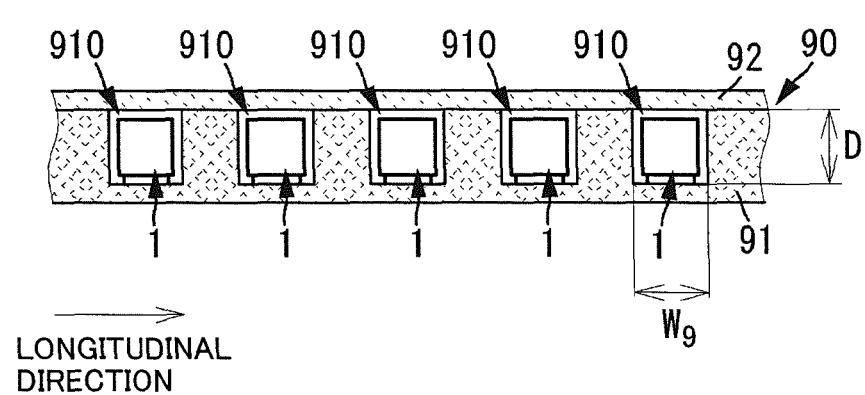
FIG. 12B is a cross sectional view of the electronic component package in FIG. 12A taken along a line A-A and seen from a direction indicated by arrows.

FIG. 12A is a plan view showing a configuration of an electronic component package in accordance with an eighth preferred embodiment of the present invention. FIG. 12B is a cross sectional view of the electronic component package in FIG. 12A taken along a line A-A and seen from a direction indicated by arrows. As shown in FIGS. 12A, 12B, the electronic component package includes electronic components and a carrier tape.

As shown in FIG. 12A, a carrier tape 90 includes a tape main body 91 and a lid 92. In tape main body 91, a plurality of accommodation holes 910 accommodating electronic components 1 are provided along a longitudinal direction of tape main body 91 to be spaced from one another. As seen in a plan view (i.e., as seen from an aperture side), accommodation hole 910 has a shape which is short in the longitudinal direction of tape main body 91 and is long in a shorter direction perpendicular or substantially perpendicular to the longitudinal direction. The dimension of a width $W_9$ (i.e., a length along the longitudinal direction of tape main body 91) of accommodation hole 910 is smaller than the dimension of a depth D of accommodation hole 910. In accommodation holes 910, apertures are covered with lid 92.

As shown in FIG. 12B, electronic component 1 is accommodated in accommodation hole 910 in carrier tape 90 such that substrate-type terminal 3 is located on a bottom surface side of accommodation hole 910. If the dimension of substrate main body 31 in the shorter direction thereof is greater than the dimension of laminated capacitor 2 in the shorter direction thereof, the dimension of a bottom surface of the accommodation hole in a shorter direction thereof is increased in accordance with the dimension of substrate main body 31 in the shorter direction thereof. When the dimension of the bottom surface of accommodation hole 910 in the shorter direction thereof (width $W_9$) is large, electronic component 1 tends to be overturned within accommodation hole 910, which is not preferable.

The dimension of the bottom surface of accommodation hole 910 in the shorter direction thereof can be decreased in accordance with the dimension of substrate main body 31 in the shorter direction thereof, for example, by setting the dimension of substrate main body in the shorter direction thereof to be smaller than, i.e., preferably less than about 1.0 times, the dimension of laminated capacitor 2 in the shorter direction thereof, as in the electronic components illustrated in the first, fifth, sixth, and seventh preferred embodiments described above. Overturning of laminated capacitor 2 is significantly reduced or prevented by decreasing the dimension of the bottom surface of accommodation hole 910 in the shorter direction thereof. When the end surfaces of laminated capacitor 2 have a square or substantially square shape, it is preferable to set the dimension of the bottom surface of accommodation hole 910 in the shorter direction thereof to be smaller than the dimension of the depth of the accommodation hole. Here, a substantially square shape indicates that a difference in the lengths of perpendicular or substantially perpendicular sides is less than or equal to about 20%.

Although the preferred embodiments of the present invention have been described, it should be understood that the preferred embodiments disclosed herein are illustrative and non-restrictive in every respect. The scope of the present invention is defined by the scope of the claims, and is intended to include any modifications within the scope and meaning equivalent to the scope of the claims.

What is claimed is:

1. An electronic component, comprising:
a laminated capacitor including a plurality of dielectric layers and a plurality of internal electrodes defining a laminate, and a first external electrode and a second external electrode electrically connected to the internal electrodes and located on both end surfaces of the laminate in a longitudinal direction, respectively; and
a substrate-type terminal including an insulating substrate main body, a first component connection electrode located on a first main surface of the substrate main body on which the laminated capacitor is arranged, and connected to the first external electrode, a second component connection electrode located on the first main surface of the substrate main body and connected to the second external electrode, a first external connection electrode located on a second main surface of the substrate main body opposite to the first main surface, a second external connection electrode located on the second main surface of the substrate main body, a first connection electrode connecting the first component connection electrode and the first external connection electrode, and a second connection electrode connecting the second component connection electrode and the second external connection electrode; wherein
the substrate main body includes an inorganic material;
the substrate main body has a thickness of more than or equal to about 0.05 mm and less than or equal to about 0.4 mm;
the substrate main body has a Young's modulus of more than or equal to about 100 GPa and less than or equal to about 400 GPa; and
a dimension of the substrate main body in a shorter direction of the laminate perpendicular or substantially perpendicular to the longitudinal direction is less than a dimension of the laminated capacitor in the shorter direction, and a dimension of the substrate main body in the longitudinal direction of the laminate is greater than a dimension of the laminated capacitor in the longitudinal direction, or
the dimension of the substrate main body in the longitudinal direction is less than the dimension of the laminated capacitor in the longitudinal direction, and the dimension of the substrate main body in the shorter direction is greater than the dimension of the laminated capacitor in the shorter direction.

2. The electronic component according to claim 1, wherein the Young's modulus of the substrate main body is higher than a Young's modulus of a dielectric material constituting the dielectric layers of the laminate.

3. The electronic component according to claim 1, wherein the inorganic material includes alumina.

4. The electronic component according to claim 3, wherein the inorganic material contains a glass component.

5. The electronic component according to claim 1, wherein a surface direction of the internal electrodes is perpendicular or substantially perpendicular to a mounting surface of the substrate-type terminal on which the laminated capacitor is mounted.

6. The electronic component according to claim 1, wherein
a groove portion recessed to a position overlapping with the laminated capacitor when the substrate main body having the laminated capacitor arranged thereon is seen from a direction perpendicular or substantially perpendicular to the first main surface is located in the substrate main body; and
each of the first connection electrode and the second connection electrode is located on a side wall surface of the groove portion.

7. An electronic component package, comprising:
a plurality of electronic components as recited in claim 1; and
a carrier tape including a plurality of accommodation holes respectively accommodating the electronic components; wherein
the electronic component is accommodated in the accommodation hole such that the substrate-type terminal is located on a bottom surface side of the accommodation hole; and
in the carrier tape, a dimension of a bottom surface of the accommodation hole in a shorter direction is smaller than a dimension of a depth of the accommodation hole.

8. An electronic component, comprising:
a laminated capacitor including a plurality of dielectric layers and a plurality of internal electrodes defining a laminate, and a first external electrode and a second external electrode electrically connected to the internal electrodes and located on both end surfaces of the laminate in a longitudinal direction, respectively; and
a substrate-type terminal including an insulating substrate main body, a first component connection electrode located on a first main surface of the substrate main body on which the laminated capacitor is arranged, and connected to the first external electrode, a second component connection electrode located on the first main surface of the substrate main body and connected to the second external electrode, a first external connection electrode located on a second main surface of the substrate main body opposite to the first main surface, a second external connection electrode located on the second main surface of the substrate main body, a first connection electrode connecting the first component connection electrode and the first external connection electrode, and a second connection electrode connecting the second component connection electrode and the second external connection electrode; wherein
in a shorter direction of the laminate perpendicular or substantially perpendicular to the longitudinal direction, a dimension of the substrate main body is smaller than a dimension of the laminated capacitor.

9. The electronic component according to claim 8, wherein, in the shorter direction, the dimension of the substrate main body is more than or equal to about 0.8 times and less than about 1.0 times the dimension of the laminated capacitor.

10. The electronic component according to claim 8, wherein
in the substrate main body, a first groove portion and a second groove portion penetrating from the first main surface to the second main surface of the substrate main body are provided in end surfaces or side surfaces connecting the first main surface and the second main surface;
the first connection electrode is provided on a side wall surface of the first groove portion; and the second connection electrode is provided on a side wall surface of the second groove portion.

11. The electronic component according to claim 10, wherein
at least a portion of the first connection electrode is spaced relative to the end surface or the side surface; and
at least a portion of the second connection electrode is spaced relative to the end surface or the side surface.

12. The electronic component according to claim 8, wherein, in the longitudinal direction of the laminate, a dimension of the substrate main body is smaller than a dimension of the laminated capacitor.

13. An electronic component package, comprising:
a plurality of electronic components as recited in claim 8; and
a carrier tape including a plurality of accommodation holes respectively accommodating the electronic components; wherein
the electronic component is accommodated in the accommodation hole such that the substrate-type terminal is located on a bottom surface side of the accommodation hole; and
in the carrier tape, a dimension of a bottom surface of the accommodation hole in a shorter direction is smaller than a dimension of a depth of the accommodation hole.

14. An electronic component, comprising:
a laminated capacitor including a plurality of dielectric layers and a plurality of internal electrodes defining a laminate, and a first external electrode and a second external electrode electrically connected to the internal electrodes and located on both end surfaces of the laminate in a longitudinal direction, respectively; and
a substrate-type terminal including an insulating substrate main body, a first component connection electrode located on a first main surface of the substrate main body on which the laminated capacitor is arranged, and connected to the first external electrode, a second component connection electrode located on the first main surface of the substrate main body and connected to the second external electrode, a first external connection electrode located on a second main surface of the substrate main body opposite to the first main surface, a second external connection electrode located on the second main surface of the substrate main body, a first connection electrode connecting the first component connection electrode and the first external connection electrode, and a second connection electrode connecting the second component connection electrode and the second external connection electrode; wherein
in the longitudinal direction of the laminate, a dimension of the substrate main body is smaller than a dimension of the laminated capacitor.

15. The electronic component according to claim 14, wherein, in the longitudinal direction of the laminate, the dimension of the substrate main body is more than or equal to about 0.8 times and less than about 1.0 times the dimension of the laminated capacitor.

16. The electronic component according to claim 14, wherein
in the substrate main body, a first groove portion and a second groove portion penetrating from the first main surface to the second main surface of the substrate main body are provided in end surfaces or side surfaces connecting the first main surface and the second main surface;
the first connection electrode is provided on a side wall surface of the first groove portion; and
the second connection electrode is provided on a side wall surface of the second groove portion.

17. The electronic component according to claim 16, wherein
at least a portion of the first connection electrode is spaced relative to the end surface or the side surface; and
at least a portion of the second connection electrode is spaced relative to the end surface or the side surface.

18. An electronic component package, comprising:
a plurality of electronic components as recited in claim 14; and
a carrier tape including a plurality of accommodation holes respectively accommodating the electronic components; wherein
the electronic component is accommodated in the accommodation hole such that the substrate-type terminal is located on a bottom surface side of the accommodation hole; and
in the carrier tape, a dimension of a bottom surface of the accommodation hole in a shorter direction is smaller than a dimension of a depth of the accommodation hole.

* * * * *